US012750043B2

(12) United States Patent
M et al.

(10) Patent No.: US 12,750,043 B2
(45) Date of Patent: Sep. 29, 2026

(54) FLIP-FLOP WITH A HIGH-SPEED ARCHITECTURE

(71) Applicant: Google LLC, Mountain View, CA (US)

(72) Inventors: Naveen Kumar M, Bengaluru (IN); Gururaj K. Shamanna, Austin, TX (US); Ayush Kulshrestha, Bengaluru (IN); Polepalli Harish Kumar, Anantapur (IN)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/899,902

(22) Filed: Sep. 27, 2024

(65) Prior Publication Data

US 2026/0095162 A1 Apr. 2, 2026

(51) Int. Cl.
*H03K 3/356* (2006.01)
*H03K 3/037* (2006.01)

(52) U.S. Cl.
CPC ........... *H03K 3/356* (2013.01); *H03K 3/0372* (2013.01)

(58) Field of Classification Search
CPC ............. H03K 3/356; H03K 3/356052; H03K 3/35606; H03K 3/356069; H03K 3/356078; H03K 3/356104; H03K 3/356113; H03K 3/356121; H03K 3/356147; H03K 3/3562; H03K 3/35625; H03K 3/037; H03K 3/0372; H03K 19/0941; H03K 19/0944; H03K 19/0948; H03K 3/02332; H03K 3/289
See application file for complete search history.

(56) References Cited

U.S. PATENT DOCUMENTS

2009/0262588 A1* 10/2009 Vilangudipitchai ........................ H03K 3/0375 365/189.11

* cited by examiner

*Primary Examiner* — Jung Kim
(74) *Attorney, Agent, or Firm* — Colby Nipper PLLC

(57) ABSTRACT

Techniques and apparatuses are described that implement a flip-flop with a high-speed architecture. In example aspects, the high-speed architecture of the flip-flop is a two-path architecture, which represents a hybrid combination of multiple topologies controlled by different clock signals. At a first path of the flip-flop, the high-speed architecture has a pulsed-latch topology, which enables the flip-flop to have a smaller insertion delay relative to other flip-flops with a single-path architecture based on the master-slave topology. At a second path of the flip-flop, the high-speed architecture has a master-slave topology to satisfy the hold time requirement of the flip-flop without relying on additional buffers. The high-speed architecture can be used to implement a scan-type flip-flop, including settable and/or resettable versions of the scan-type flip-flop. With the high-speed architecture, the flip-flop can operate at higher clock frequencies compared to other flip-flops with single-path architectures.

20 Claims, 15 Drawing Sheets

FLIP-FLOP WITH A HIGH-SPEED ARCHITECTURE

BACKGROUND

An electronic device's performance can be directly impacted by a frequency of its clock signal. The clock signal's frequency can determine a speed at which the electronic device can complete tasks or execute instructions. The ever-growing demands of contemporary technology require devices to operate at higher clock frequencies to meet consumer and industry needs. At higher clock frequencies, the electronic device can complete more operations per second. As such, the electronic device can perform more work for the user and realize a higher level of responsiveness compared to electronic devices operating at lower clock frequencies. It can be challenging, however, to design an electronic device that can support these higher clock frequencies.

SUMMARY

Techniques and apparatuses are described that implement a flip-flop with a high-speed architecture. In example aspects, the high-speed architecture is a two-path architecture, which represents a hybrid combination of multiple topologies that are controlled by different clock signals. At a first path of the flip-flop, the high-speed architecture has a pulsed-latch topology, which enables the flip-flop to have a smaller insertion delay relative to other flip-flops with a single-path architecture based on the master-slave topology. At a second path of the flip-flop, the high-speed architecture has a master-slave topology to satisfy the hold time requirement of the flip-flop without relying on additional buffers. The high-speed architecture can be used to implement a scan-type flip-flop, including settable and/or resettable versions of the scan-type flip-flop. With the high-speed architecture, the flip-flop can operate at higher clock frequencies compared to other flip-flops with single-path architectures.

Aspects described below include a method for operating a flip-flop with a high-speed architecture. The method includes generating a first clock signal based on a second clock signal. The first clock signal is a pulsed-version of the second clock signal and has a lower duty cycle than the second clock signal. The method also includes operating a flip-flop in a first mode to enable a first path of the flip-flop and to disable a second path of the flip-flop. The method additionally includes propagating, based on the operating of the flip-flop in the first mode, a first signal along the first path from a first input of the flip-flop to an output of the flip-flop using the first clock signal. The method further includes operating the flip-flop in a second mode to enable the second path and to disable the first path. The method also includes propagating, based on the operating of the flip-flop in the second mode, a second signal from a second input of the flip-flop to the output along the second path using the second clock signal.

Aspects described below also include an apparatus with a flip-flop having a high-speed architecture. The flip-flop has an architecture that includes a first path and a second path. The first path has a pulsed-latch topology between a first input of the flip-flop and an output of the flip-flop. The second path has a master-slave topology between a second input of the flip-flop and the output of the flip-flop. The flip-flop also includes a keeper circuit, which is coupled between a shared node of the flip-flop and the output. The keeper circuit exists within the first and second paths. The keeper circuit represents a portion of the pulsed-latch topology and represents a portion of the master-slave topology.

Aspects described below include a system with a flip-flop having a high-speed architecture.

BRIEF DESCRIPTION OF DRAWINGS

Apparatuses for and techniques that implement a flip-flop with a high-speed architecture are described with reference to the following drawings. The same numbers are used throughout the drawings to reference like features and components:

FIG. 7-1 illustrates an example first mode of a flip-flop with a high-speed architecture;

FIG. 7-2 illustrates an example second mode of a flip-flop with a high-speed architecture;

FIG. 9-1 illustrates a first portion of an example implementation of a scan-type flip-flop with a high-speed architecture;

FIG. 9-2 illustrates a second portion of an example implementation of a scan-type flip-flop with a high-speed architecture;

FIG. 10-1 illustrates a first portion of an example implementation of a resettable scan-type flip-flop with a high-speed architecture;

FIG. 10-2 illustrates a second portion of an example implementation of a resettable scan-type flip-flop with a high-speed architecture;

DETAILED DESCRIPTION

Figure 1:
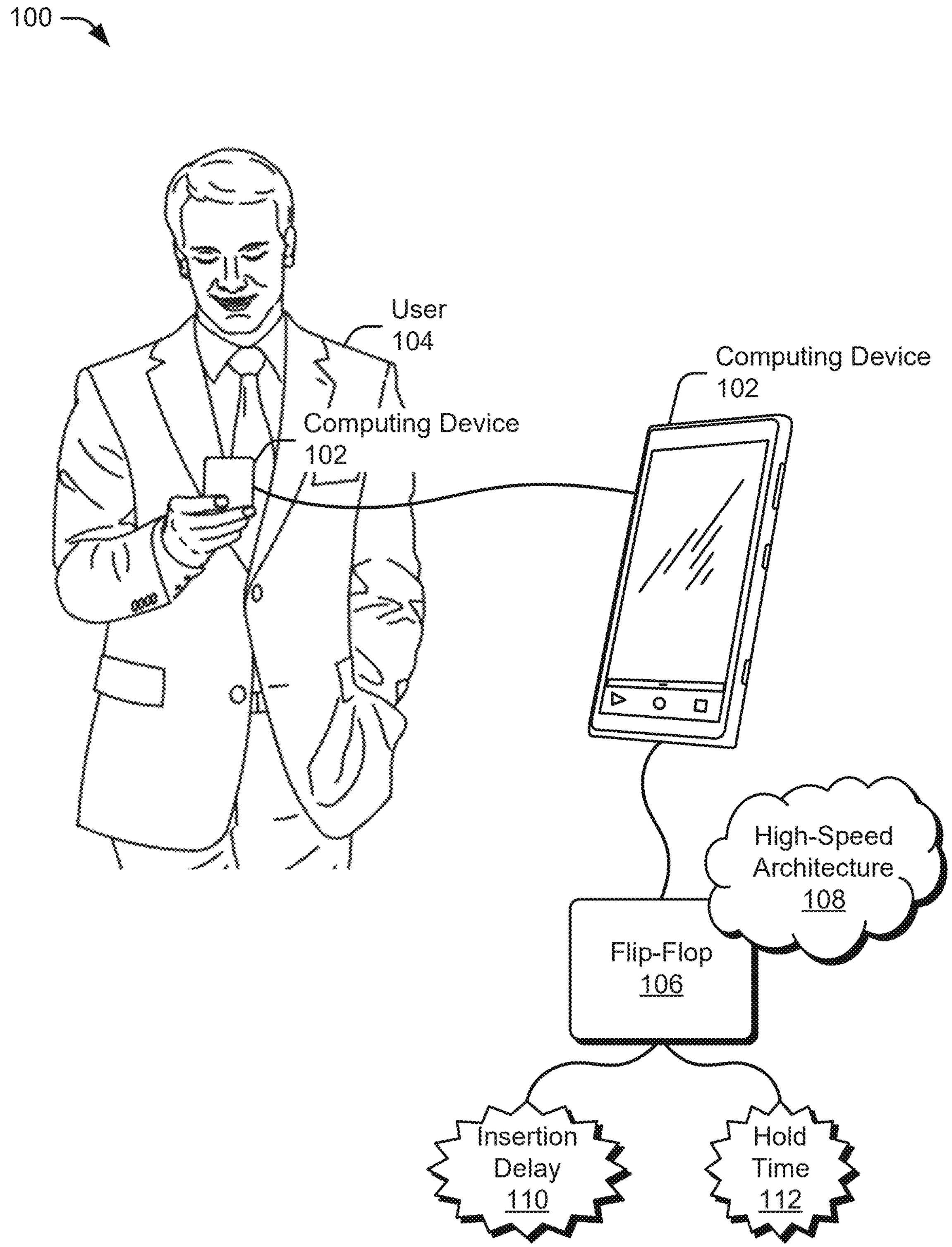
FIG. 1 illustrates an example environment in which a flip-flop with a high-speed architecture can be implemented.

The ever-growing demands of contemporary technology require electronic devices to operate at higher clock frequencies to meet consumer and industry needs. Designing an electronic device capable of supporting these higher clock frequencies can present challenges. Some components of the electronic device, for instance, can have inherent timing constraints, which can restrict the clock frequency. One such component is a flip-flop.

A flip-flop is a circuit with two stable states that output different logic values. In a first state (e.g., a "set" state), the flip-flop outputs a first logic value of "1." In a second state (e.g., a "reset" or "cleared" state), the flip-flop outputs a second logic value of "0." Based on a triggering event (e.g., a clock signal's active edge), the flip-flop can "flip" or "flop" between these two states. An electronic device can use a flip-flop to store a single bit of information. The flip-flop can be used to implement and/or support other circuits, including a synchronization circuit, a frequency divider, control logic, sequential logic, combinatorial logic, a delay line, a shift register, a counter circuit, a test circuit, and so forth.

Various flip-flop architectures can have different timing constraints that restrict the clock frequencies that can be supported. A first example timing constraint is an insertion delay of the flip-flop. The insertion delay represents a time it takes for data that is received at an input of the flip-flop to be provided at an output of the flip-flop. The insertion delay includes a setup time of the flip-flop and a clock-to-output delay of the flip-flop. The setup time represents a minimum time that an input signal must be stable prior to a clock signal's active edge for it to be latched correctly by the flip-flop. The clock-to-output delay represents the time it takes for the flip-flop to change its output after the clock signal's active edge. The insertion delay can present a bottleneck in an operation of the flip-flop, thereby limiting the clock frequencies that can be supported. A second example timing constraint is a hold time of the flip-flop. The hold time represents a minimum time after the clock signal's active edge during which an input signal is to remain stable.

Some flip-flops include multiple inputs, a multiplexer, and a single-path architecture. The multiplexer selectively couples the multiple inputs to other components disposed with the single-path architecture. During operation, the flip-flop can propagate different input signals, which are respectively provided at the multiple inputs, along a same path to an output. This single-path architecture can make it challenging for the flip-flop to operate at higher clock frequencies because of the difficulty associated with designing a flip-flop that can realize a smaller insertion delay while satisfying the hold time, as further explained below.

A first example flip-flop has a single-path architecture based on a master-slave topology. With the master-slave topology, the flip-flop includes multiple latches between the multiplexer and the output. These multiple latches impact the insertion delay of the flip-flop, which can make it challenging for the flip-flop to operate at the higher clock frequencies.

To address this issue, a second example flip-flop has a single-path architecture based on a pulsed-mode topology. With the pulsed-latch topology, the flip-flop includes a single latch between the multiplexer and the output. With fewer latches, a flip-flop with the pulsed-mode topology can realize a smaller insertion delay compared to a flip-flop with the master-slave topology. The pulsed-latch topology, however, may be unable to satisfy the hold-time requirement of one of the inputs. This can be particularly applicable for flip-flops that receive different input signals associated with different propagation path delays, as further described below.

Consider a scan-type flip-flop, which can receive a data signal at a data pin and can receive a scan-in signal at a scan-in pin. In some implementations, the data signal has a significantly longer propagation delay compared to the scan-in signal because the data signal propagates through combinational logic while the scan-in signal bypasses the combinational logic. The longer propagation delay of the data signal can be sufficient for meeting the hold-time requirement at the data pin. However, the shorter propagation delay of the scan-in signal may not be sufficient for meeting the hold-time requirement at the scan-in pin.

To address this issue, some electronic devices are implemented with additional buffers. In the case of the scan-type flip-flop, these additional buffers can increase the propagation delay of the scan-in signal to meet the hold-time requirement at the scan-in pin. Although the buffers enable the hold-time requirement to be met, the buffers can increase a cost and increase a footprint of the electronic device. The buffers can also leak current, which can reduce a power efficiency of the electronic device. It can therefore be challenging to design a flip-flop that can support higher clock frequencies by realizing a smaller insertion delay and without using additional buffers to satisfy a hold-time requirement of the flip-flop.

To address this challenge, techniques and apparatuses are described that implement a flip-flop with a high-speed architecture. In example aspects, the high-speed architecture is a two-path architecture, which is implemented using a hybrid combination of multiple topologies that are controlled by different clock signals. By providing two distinct paths between two inputs of the flip-flop and an output of the flip-flop, the high-speed architecture can address and mitigate the time constraints associated with other single-path architectures. At a first path of the flip-flop, the high-speed architecture has a pulsed-latch topology, which enables the flip-flop to have a smaller insertion delay relative to other flip-flops with a single-path architecture based on the master-slave topology. A difference in the insertion delays between these two types of architectures can be approximately 30% or more in some example implementations. At a second path of the flip-flop, the high-speed architecture has a master-slave topology to satisfy the hold time requirement of the flip-flop without relying on additional buffers. As such, the flip-flop with the high-speed architecture can enable the electronic device to realize a higher power efficiency compared to other implementations of the electronic device that utilize buffers to meet the hold time requirement of other flip-flops. The high-speed architecture can be used to implement a scan-type flip-flop, including settable and/or resettable versions of the scan-type flip-flop. With the high-speed architecture, the flip-flop can operate at higher clock frequencies compared to other flip-flops with single-path architectures.

Operating Environment

FIG. 1 illustrates an example environment 100 in which a flip-flop with a high-speed architecture can be implemented. In this example environment 100, a computing device 102 provides features and/or services for a user 104. Although depicted as a smartphone, the computing device 102 can include other types of devices, including those described with respect to FIG. 2. The computing device 102 includes at least one flip-flop 106 with a high-speed architecture 108. The flip-flop 106 can be used to store a single bit of information. The flip-flop can also be used to implement and/or support other circuits, including a synchronization circuit, a frequency divider, control logic, sequential logic, combinatorial logic, a delay line, a shift register, a counter circuit, a test circuit, and so forth.

The high-speed architecture 108 enables the flip-flop 106 to operate at higher clock frequencies compared to other flip-flops with single-path architectures. In an example implementation, the high-speed architecture 108 can enable the flip-flop 106 to perform operations based on a clock signal having a frequency that is greater than 400 megahertz (MHz), including frequencies above 1 or 2 gigahertz (GHz). Example frequencies of the clock signal can be approximately equal to 500 MHZ, 800 MHZ, 1 GHZ, 1.4 GHz, 2 GHZ, and so forth. While the techniques for implementing a flip-flop 106 with a high-speed architecture 108 enables the flip-flop 106 to operate at higher frequencies relative to other flip-flops, the flip-flop 106 is not limited to these higher frequencies and can perform operations based on a clock signal having a frequency that is less than 400 MHZ.

The high-speed architecture 108 is a two-path architecture, which is implemented using a hybrid combination of multiple topologies that are controlled by different clock signals. By providing two distinct paths between two inputs of the flip-flop 106 and an output of the flip-flop 106, the high-speed architecture 108 can address and mitigate the time constraints associated with other single-path architectures. Along a first path of the flip-flop 106, the high-speed architecture 108 has a first topology that enables the flip-flop 106 to have a smaller insertion delay 110 relative to other flip-flops with a single-path architecture based on a master-slave topology. Along a second path of the flip-flop 106, the high-speed architecture 108 has a second topology to satisfy a hold time 112 of the flip-flop 106 without relying on additional buffers. As such, the flip-flop 106 with the high-speed architecture 108 can enable the computing device 102 to realize a higher power efficiency compared to other computing devices that utilize buffers to meet the hold time requirement of other flip-flops.

Implementation of the multiple paths and utilization of the multiple topologies can cause the flip-flop 106 with the high-speed architecture 108 to have a slightly larger footprint and/or a slightly larger power overhead compared to other flip-flops. This increase, however, may not be significant for many applications and can be further minimized by sharing some components of the flip-flop 106 across multiple flip-flops 106. The high-speed architecture 108 and the multiple topologies are further described with respect to FIGS. 5 and 6. With the high-speed architecture 108, the flip-flop 106 can support higher clock frequencies by realizing a smaller insertion delay 110 and without using additional buffers to satisfy the hold time 112. The computing device 102 is further described with respect to FIG. 2.

Figure 2:
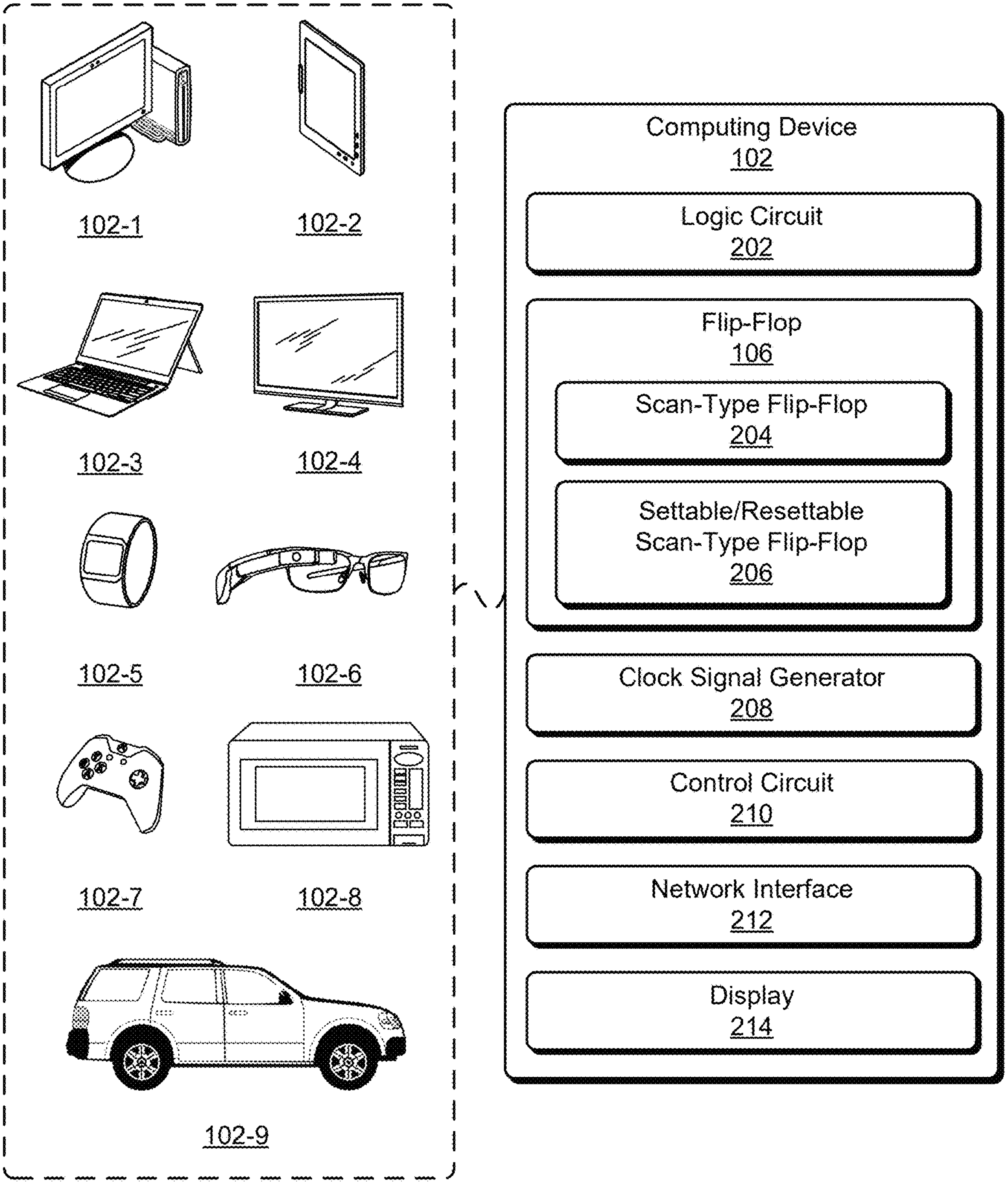
FIG. 2 illustrates an example implementation of a computing device having a flip-flop with a high-speed architecture.

FIG. 2 illustrates an example of a computing device 102 that includes the flip-flop 106 with a high-speed architecture 108. The computing device 102 is illustrated with various non-limiting example devices including a desktop computer 102-1, a tablet 102-2, a laptop 102-3, a television 102-4, a computing watch 102-5, computing glasses 102-6, a gaming system 102-7, a microwave 102-8, and a vehicle 102-9. Other devices may also be used, such as a home service device, a smart speaker, a smart thermostat, a baby monitor, a Wi-Fi™ router, a drone, a trackpad, a drawing pad, a netbook, an e-reader, a home automation and control system, a wall display, and another home appliance. Note that the computing device 102 can be wearable, non-wearable but mobile, or relatively immobile (e.g., desktops and appliances).

In some implementations, the computing device 102 includes at least one logic circuit 202, such as a combinational logic circuit or a sequential logic circuit. The logic circuit 202 includes multiple logic gates, which can generate one or more outputs based on one or more inputs. The logic circuit 202 can perform an arithmetic, implement a state machine, perform encoding or decoding, and so forth.

The flip-flop 106 can be coupled to or integrated within the logic circuit 202. Example pins of the flip-flop 106 are further described with respect to FIG. 3. Example components of the flip-flop 106 are further described with respect to FIG. 5.

Some example implementations of the flip-flop 106 represent a scan-type flip-flop 204. The scan-type flip-flop 204 is a D-type flip-flop with two inputs that are multiplexed together. The scan-type flip-flop 204 can selectively operate in a functional mode (e.g., a data mode) or a scan mode. In the functional mode, the scan-type flip-flop 204 passes data, which can be provided by the logic circuit 202, to an output. In the scan mode, the scan-type flip-flop 204 passes scan-in data (e.g., test data) to the output. Multiple scan-type flip-flops 204 can be coupled together in series to form a scan chain, as further described with respect to FIG. 4.

In other example implementations, the flip-flop 106 represents a settable and/or a resettable scan-type flip-flop 206. The settable and/or resettable scan-type flip-flop 206 can be forced to a set state and/or a reset state based on a state of a set and/or reset signal. The settable and/or resettable scan-type flip-flop 206 represents a version of the scan-type flip-flop 204. As such, examples described herein with respect to the scan-type flip-flop 204 can similarly relate to the settable and/or resettable scan-type flip-flop 206.

The computing device 102 can also include at least one clock signal generator 208 and at least one control circuit 210. The clock signal generator 208 generates one or more clock signals, which are provided to the flip-flop 106. In the example shown in FIG. 3, the clock signal generator 208 generates two clock signals. A first one of the two clock signals represents a pulsed version of a second one of the two clock signals.

The control circuit 210 controls a state of the flip-flop 106. For example, the control circuit 210 can generate one or more signals that cause the flip-flop 106 to be in a first mode (e.g., the functional mode), which is further described with respect to FIG. 7-1, or a second mode (e.g., the scan mode), which is further described with respect to FIG. 7-2.

The computing device 102 can also include a network interface 212 for communicating data over wired, wireless, or optical networks. For example, the network interface 212 may communicate data over a local-area-network (LAN), a wireless local-area-network (WLAN), a personal-area-network (PAN), a wire-area-network (WAN), an intranet, the Internet, a peer-to-peer network, point-to-point network, a mesh network, Bluetooth®, and the like. The computing device 102 may also include the display 214. Example inputs and outputs of the flip-flop 106 are further described with respect to FIG. 3.

Figure 3:
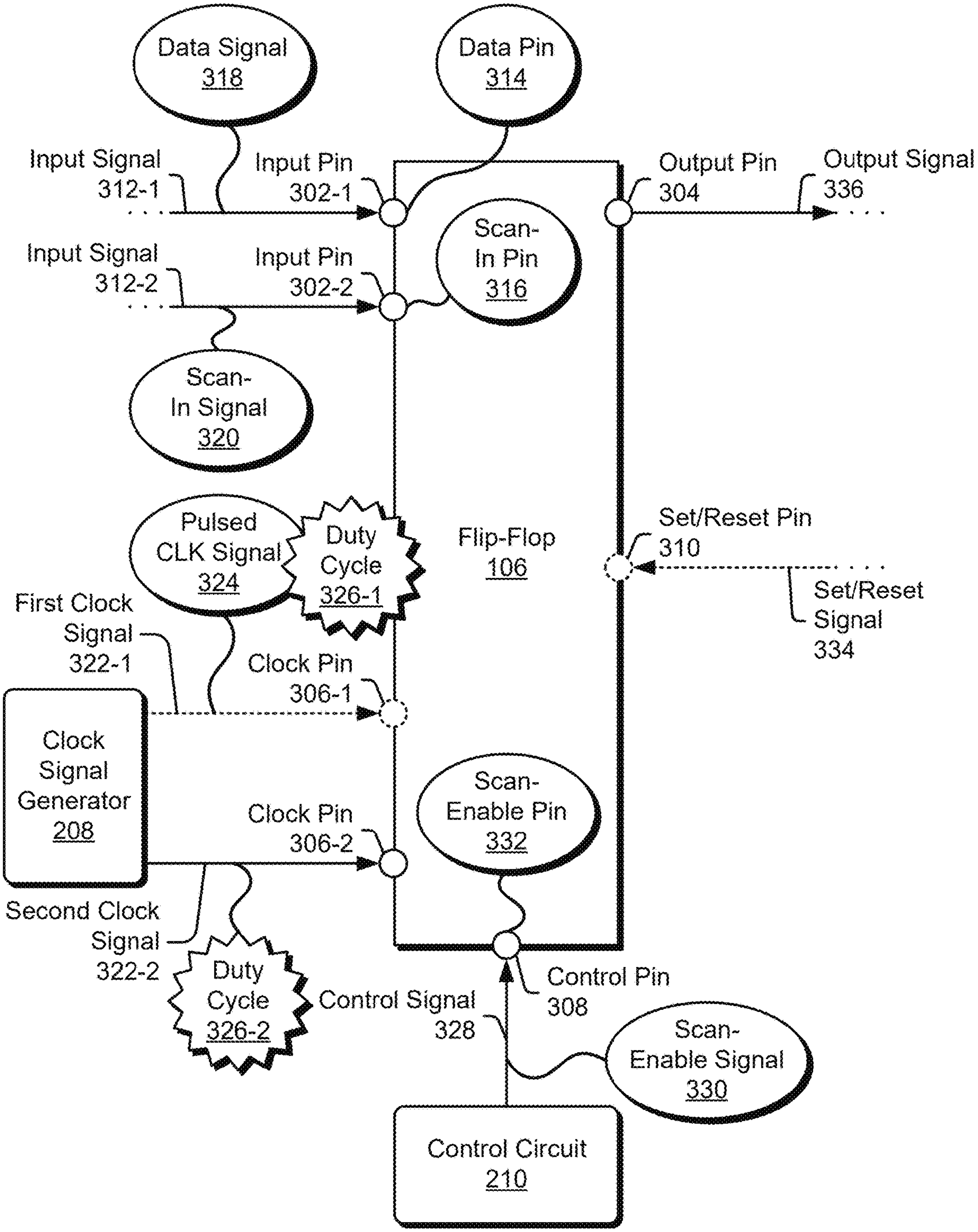
FIG. 3 illustrates an example relationship between a flip-flop, a clock signal generator, and a control circuit.

FIG. 3 illustrates an example relationship between the flip-flop 106, the clock signal generator 208, and the control circuit 210. In the depicted configuration, the flip-flop 106 is shown to include two input pins 302-1 and 302-2, an output pin 304, clock pins 306-1 and/or 306-2, a control pin 308, and a set/reset (SR) pin 310. The flip-flop 106 is coupled to the clock signal generator 208 via the clock pins 306-1 and/or 306-2. Additionally, the flip-flop 106 is coupled to the control circuit 210 via the control pin 308.

Some implementations of the flip-flop 106 may not include the first clock pin 306-1, as indicated by the dashed lines. Also, some implementations of the flip-flop 106 may not include the set/reset pin 310. Although the set/reset pin 310 is illustrated as a single pin in FIG. 3, in some cases it can be implemented using two distinct pins. In this case, one of the pins can be used to set the flip-flop 106 and another one of the pins can be used to reset the flip-flop 106.

The flip-flop 106 can receive input signals 312-1 and 312-2 at the input pins 302-1 and 302-2, respectively. For cases in which the flip-flop 106 implements the scan-type flip-flop 204, the first input pin 302-1 can represent a data pin 314 and the second input pin 302-1 can represent a scan-in (SI) pin 316. As such, the first input signal 312-1 can represent a data signal 318, and the second input signal 312-2 can represent a scan-in (SI) signal 320.

In some implementations, the clock signal generator 208 generates clock signals 322-1 and 322-2. More specifically, the clock signal generator 208 generates the first clock signal 322-1 based on the second clock signal 322-2 using a pulse generator. In other implementations in which the clock signal generator 208 generates the second clock signal 322-2 and does not generate the first clock signal 322-1, the flip-flop 106 can include one or more additional components (e.g., a pulse generator) to generate the first clock signal 322-1 based on the second clock signal 322-2. In this case, the flip-flop 106 can include the second clock pin 306-2 and may not include the first clock pin 306-1.

The first clock signal 322-1 is a pulsed clock signal 324. More specifically, the first clock signal 322-1 represents a pulsed version of the second clock signal 322-2. This means that the first clock signal 322-1 has a first duty cycle 326-1 that is lower than a second duty cycle 326-2 of the second clock signal 322-2. For example, the second duty cycle 326-2 of the second clock signal 322-2 can be approximately 50% while the first duty cycle 326-1 of the first clock signal 322-1 can be less than approximately 50% (e.g., can be approximately equal to 45%, 40%, 35%, 30%, and so forth). This also means that a pulsewidth of the first clock signal 322-1 is smaller than a pulsewidth of the second clock signal 322-2. The pulsewidth of the first clock signal 322-1 is sufficiently wide enough to ensure the flip-flop 106 can correctly latch the input signal 312-1.

Active edges of the clock signals 322-1 and 322-2 represent triggering events, which enable the flip-flop 106 to change states. In the case of the scan-type flip-flop 204, the clock signals 322-1 and 322-2 respectively provide the triggering events for the functional mode and the scan mode. As such, the first clock signal 322-1 can be referred to as a functional clock signal, and the second clock signal 322-2 can be referred to as a scan clock signal. The flip-flop 106 receives the clock signals 322-1 and 322-2 at the clock pins 306-1 and 306-2, respectively.

The control circuit 210 generates a control signal 328, which causes the flip-flop 106 to be in a particular mode. For implementations in which the flip-flop 106 represents the scan-type flip-flop 204, the control signal 328 can represent a scan-enable (SE) signal 330. In this case, the control pin 308 represents a scan-enable pin 332. The scan-enable (SE) signal 330 and the scan-enable pin 332 can alternatively be referred to as a test-enable (TE) signal and a test-enable pin, respectively.

If the flip-flop 106 is the settable/resettable flip-flop 206, the flip-flop 106 can include the set/reset pin 310. At the set/reset pin 310, the flip-flop 106 receives a set/reset signal 334. In some implementations, the control circuit 210, or another circuit of the computing device 102, can provide the set/reset signal 334 to the set/reset pin 310. The set/reset signal 334 can be asynchronous or synchronous. The set/reset signal 334 can have different states, which cause the flip-flop 106 to selectively be in a normal state, a set state, a reset state, or some combination thereof. The normal state represents a non-set state and a non-reset state. While in the normal state, the flip-flop 106 can operate according to one of the modes specified by the control signal 328.

Figure 4:
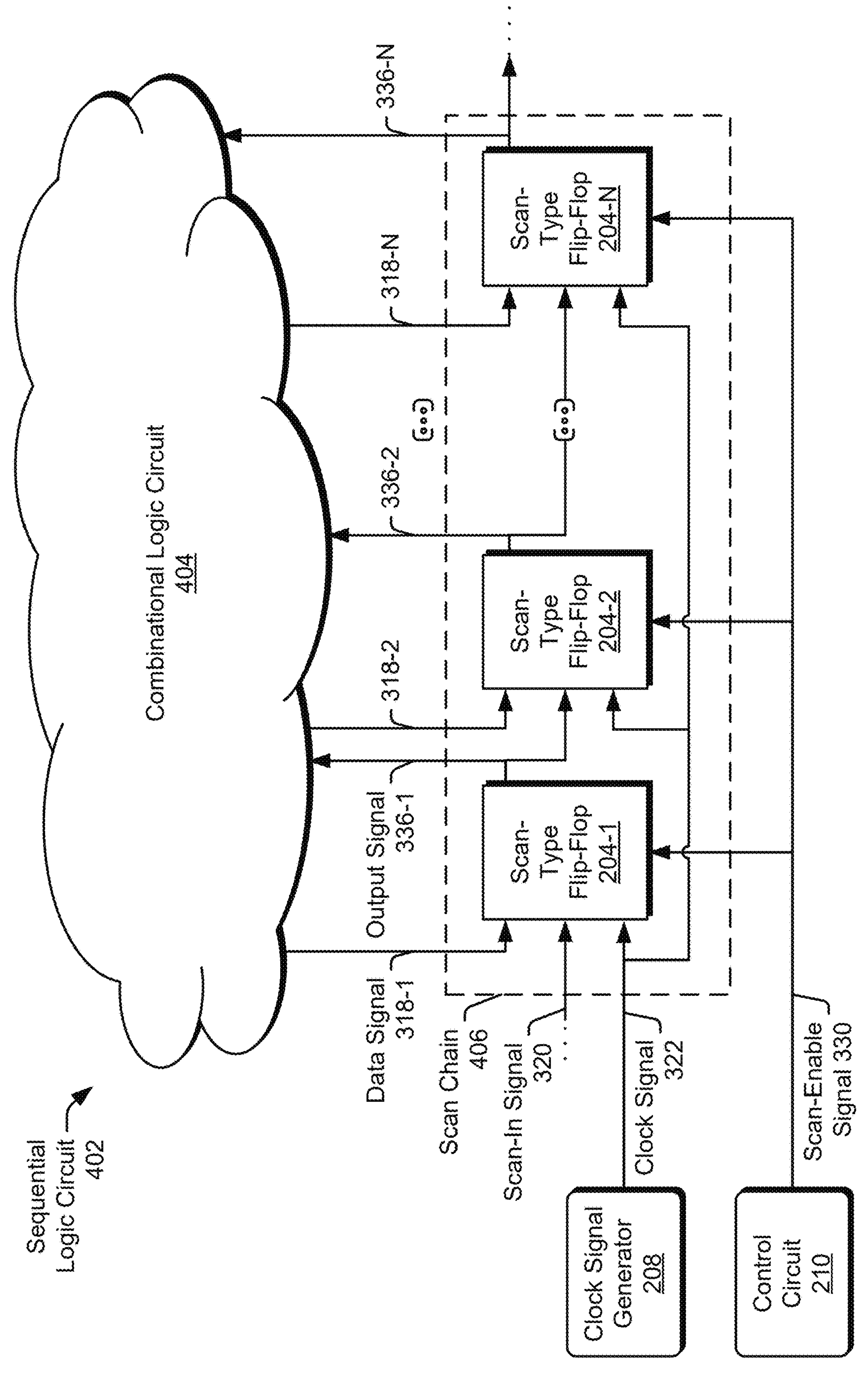
FIG. 4 illustrates an example scan chain implemented using multiple flip-flops with a high-speed architecture.

At the output pin 304, the flip-flop 106 generates an output signal 336. In some situations and/or implementations, the output signal 336 is provided to the logic circuit 202 (not shown in FIG. 3). In other situations and/or implementations, the output signal 336 is provided as the second input signal 312-1 to another flip-flop 106, as shown in FIG. 4. Depending on the control signal 328, the output signal 336 can represent the input signal 312-1 or the second input signal 312-2. In some cases, the output signal 336 can have a logic value that is set based on the set/reset signal 334. If the set/reset signal 334 causes the flip-flop 106 to be in a set state, the output signal 336 can indicate a first logic value (e.g., a logic value of "1"). Alternatively, if the set/reset signal 334 causes the flip-flop 106 to be in a reset state, the output signal 336 can indicate a second logic value (e.g., a logic value of "0").

FIG. 4 illustrates an example sequential logic circuit 402, which can represent the logic circuit 202 of FIG. 2. The sequential logic circuit 402 includes a combinational logic circuit 404 and a scan chain 406. The scan chain 406 can effectively implement a shift register and can be used to test for defects in the combinational logic circuit 404.

In the depicted configuration, the scan chain 406 includes multiple scan-type flip-flops 204-1, 204-2 . . . 204-N, where N represents a positive integer. Except for a last scan-type flip-flop 204-N within the scan chain 406, the other scan-type flip-flops 204-1 to 204-(N−1) have an output that is coupled to an input of a next scan-type flip-flop 204 within the scan chain 406. In this manner, the scan-type flip-flops 204-1 and 204-N are connected together and form a chain, as represented by the scan chain 406. The first scan-type flip-flop 204-1 has an input that can be coupled to a built-in self-test controller of the computing device 102 and/or a scan-in port of the computing device 102 in some implementations. The last scan-type flip-flop 204-N has an output that can be coupled to the built-in self-test controller and/or a scan-out port of the computing device 102. The scan-type flip-flops 204-1 to 204-N are also coupled to the combinational logic circuit 404, the clock signal generator 208, and the control circuit 210.

Consider a first example situation in which the control circuit 210 generates the scan-enable signal 330 to cause the scan-type flip-flops 204-1 to 204-N to operate in the functional mode. While in the functional mode, the scan-type flip-flops 204-1 to 204-N accept the data signals 318-1, 318-2 . . . 318-N provided by the combinational logic circuit 404. The scan-type flip-flops 204-1 to 204-N generate output signals 336-1, 336-2 . . . 336-N based on the clock signal 322 and provides the output signals 336-1 to 336-N to the combinational logic circuit 404.

Consider a second example situation in which the control circuit 210 generates the scan-enable signal 330 to cause the scan-type flip-flops 204-1 to 204-N to operate in the scan mode. While in the scan mode, the first scan-type flip-flop 204-1 accepts the scan-in signal 320. The scan-in signal 320 can be provided by the control circuit 210, the built-in self-test controller of the computing device 102, or can be provided by another external entity via the scan-in port of the computing device 102. The first scan-type flip-flop 204-1 generates the first output signal 336-1 based on the scan-in signal 320 and the clock signal 322. In this case, the first output signal 336-1 is provided as the second input signal 312-2 to the second scan-type flip-flop 204-2. The second scan-type flip-flop 204-2 similarly generates a second output signal 336-2 based on the output signal 336-1 and the clock signal 322. The second output signal 336-2 is passed to a next scan-type flip-flop 204 within the scan chain 406. The scan-type flip-flop 204-N generates an output signal 336-N based on an output signal provided by a previous scan-type flip-flop 204 within the scan chain 406. The output signal 336-N can be passed to the built-in self-test controller or a scan-out port of the computing device 102.

The scan mode can be used to feed test data into the scan-type flip-flops 204-1 to 204-N and to evaluate the combinational logic circuit 404 after engaging the functional mode and applying one clock cycle. The functional mode enables the combinational logic circuit 404 to operate on the scanned-in data and write the results of the operation to the scan chain 406. After this clock cycle, the data within the scan chain 406 can be read out using the scan mode. In this way, the scan chain 406 provides control and observability for running tests.

In this example, the clock signal 322 is generically shown as a single signal for simplicity. It is to be understood that the clock signal 322 generated by the clock signal generator 208 can represent the second clock signal 322-2 or both the first and second clock signals 322-1 and 322-2, depending on the implementation. An example implementation of the flip-flop 106 is further described with respect to FIGS. 5 and 6.

High-speed Architecture

Figure 5:
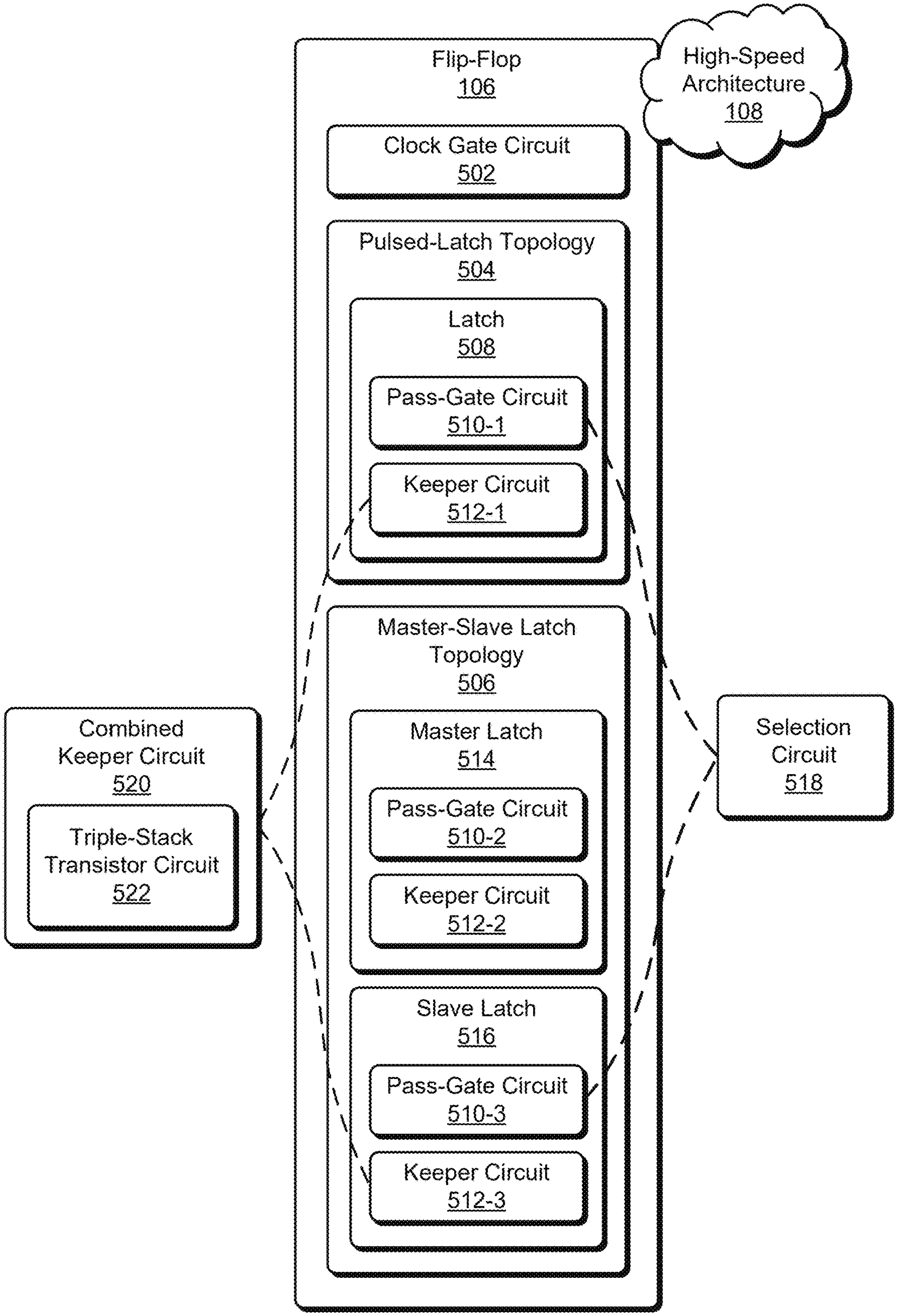
FIG. 5 illustrates example components of a flip-flop with a high-speed architecture.

FIG. 5 illustrates example components of the flip-flop 106 with the high-speed architecture 108. The flip-flop 106 includes at least one clock gate circuit 502. The clock gate circuit 502 causes the flip-flop 106 to operate in a particular mode and controls which topology is active based on the control signal 328. To implement the high-speed architecture 108, the flip-flop 106 has two distinct paths, which are implemented using two different topologies. In example implementations, the different topologies include a pulsed-latch topology 504 and a master-slave latch topology 506. The pulsed-latch topology 504 and the master-slave latch topology 506 respectively exist between the two input pins 302-1 and 302-2 and the output pin 304, as further described with respect to FIG. 6. The pulsed-latch topology 504 enables the flip-flop 106 to have a smaller insertion delay 110 while the master-slave latch topology 506 enables the flip-flop 106 to meet the hold time 112 requirement of the second input pin 302-2 (e.g., the scan-in pin 316) and obviates the need for additional buffers.

The pulsed-latch topology 504 includes a single latch 508. The latch 508 includes a first pass-gate circuit 510-1 and a first keeper circuit 512-1. The first pass-gate circuit 510-1 can selectively allow or halt signal propagation through the pulsed-latch topology 504. The first pass-gate circuit 510-1 also provides a form of isolation, which prevents, during a particular portion of a clock cycle, the output signal 336 from changing even if an associated input signal 312 changes. The first keeper circuit 512-1 acts as a memory element to retain (or hold) the output signal 336 at the output pin 304.

The master-slave latch topology 506 includes two latches, which are represented by a master latch 514 and a slave latch 516. Similar to the latch 508, the master latch 514 and the slave latch 516 each include a pass-gate circuit and a keeper circuit. In particular, the master latch 514 includes a second pass-gate circuit 510-2 and a second keeper circuit 512-2. Likewise, the slave latch 516 includes a third pass-gate circuit 510-3 and a third keeper circuit 512-3. The pass-gate circuits 510-2 and 510-3 can each selectively allow or halt signal propagation through the master-slave latch topology 506. The pass-gate circuits 510-2 and 510-3 operate on different phases of the second clock signal 322-2, as further described with respect to FIGS. 6 and 7-2. The keeper circuits 512-2 and 512-3 are similar to the keeper circuit 512-1 in that they act as a memory element to retain the output signal 336.

The first pass-gate circuit 510-1 of the pulsed-latch topology 504 and the third pass-gate circuit 510-3 of the master-slave latch topology 506 form a selection circuit 518 (e.g., a multiplexer). In the case of the scan-type flip-flop 204, the selection circuit 518 enables the flip-flop 106 to selectively generate the output signal 336 based on the first input signal 312-1 (e.g., the data signal 318) or based on the second input signal 312-2 (e.g., the scan-in signal 320).

Figures 1, 9:
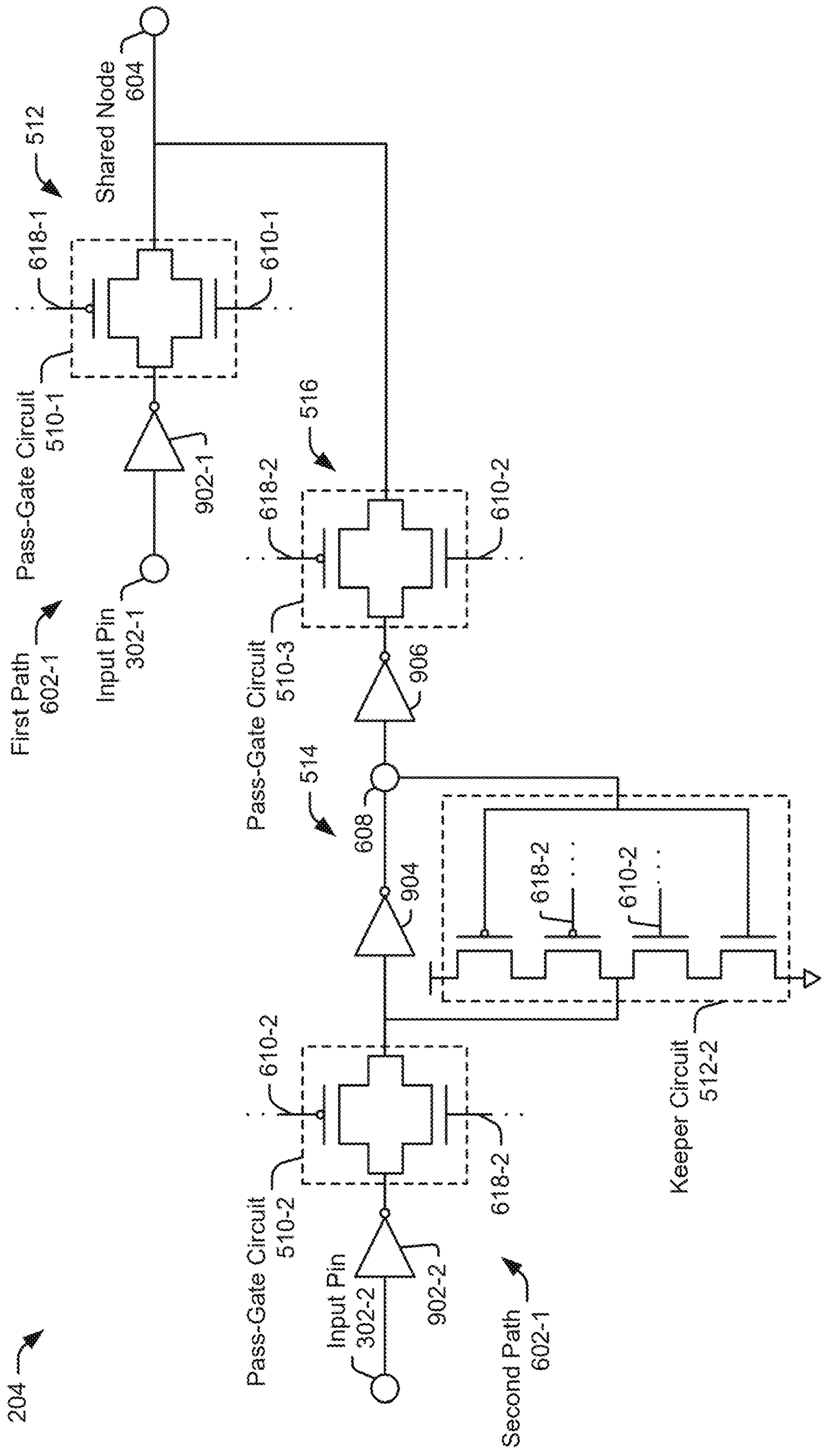
Figures 2, 9:
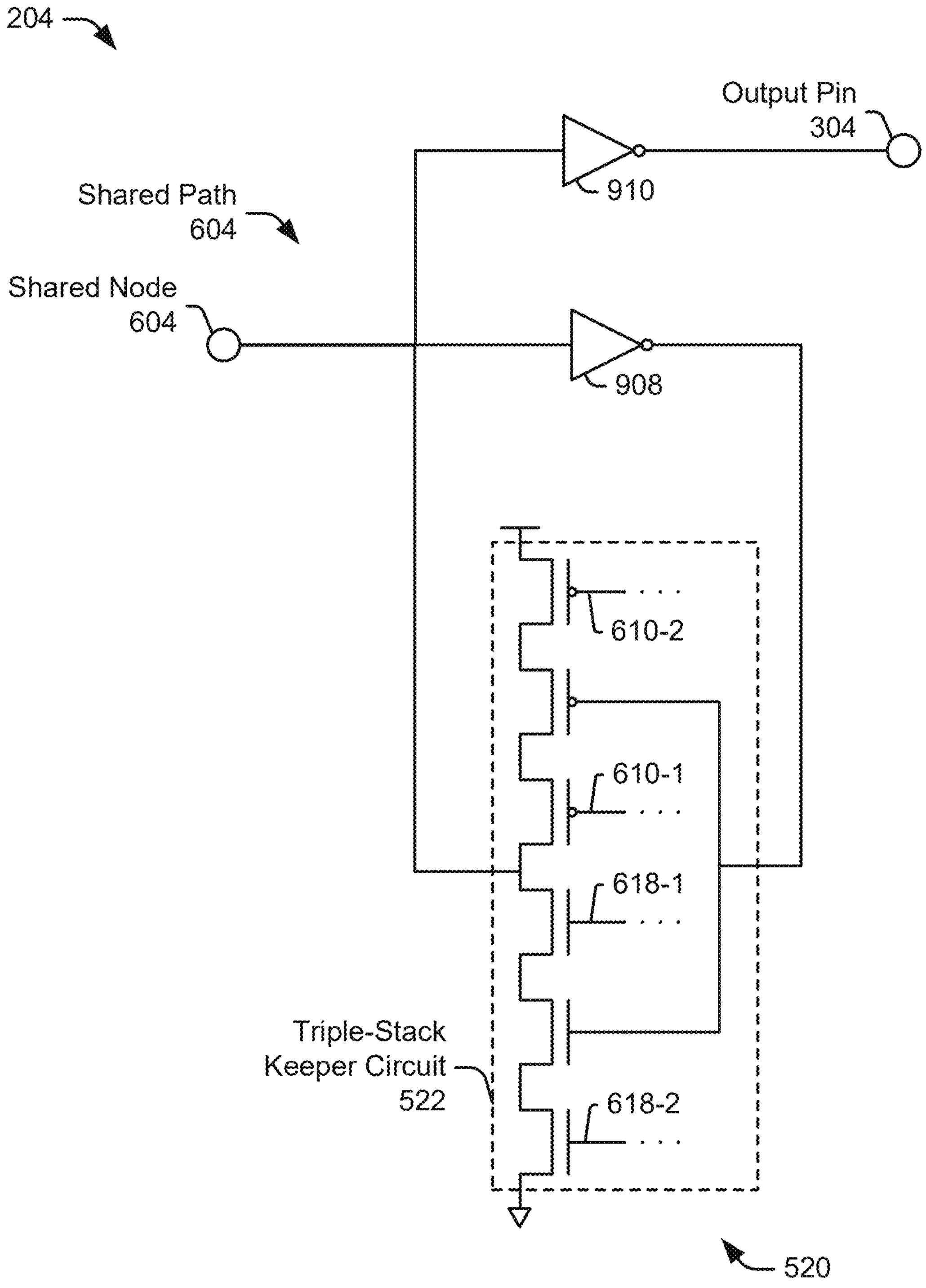
Figures 1, 10:
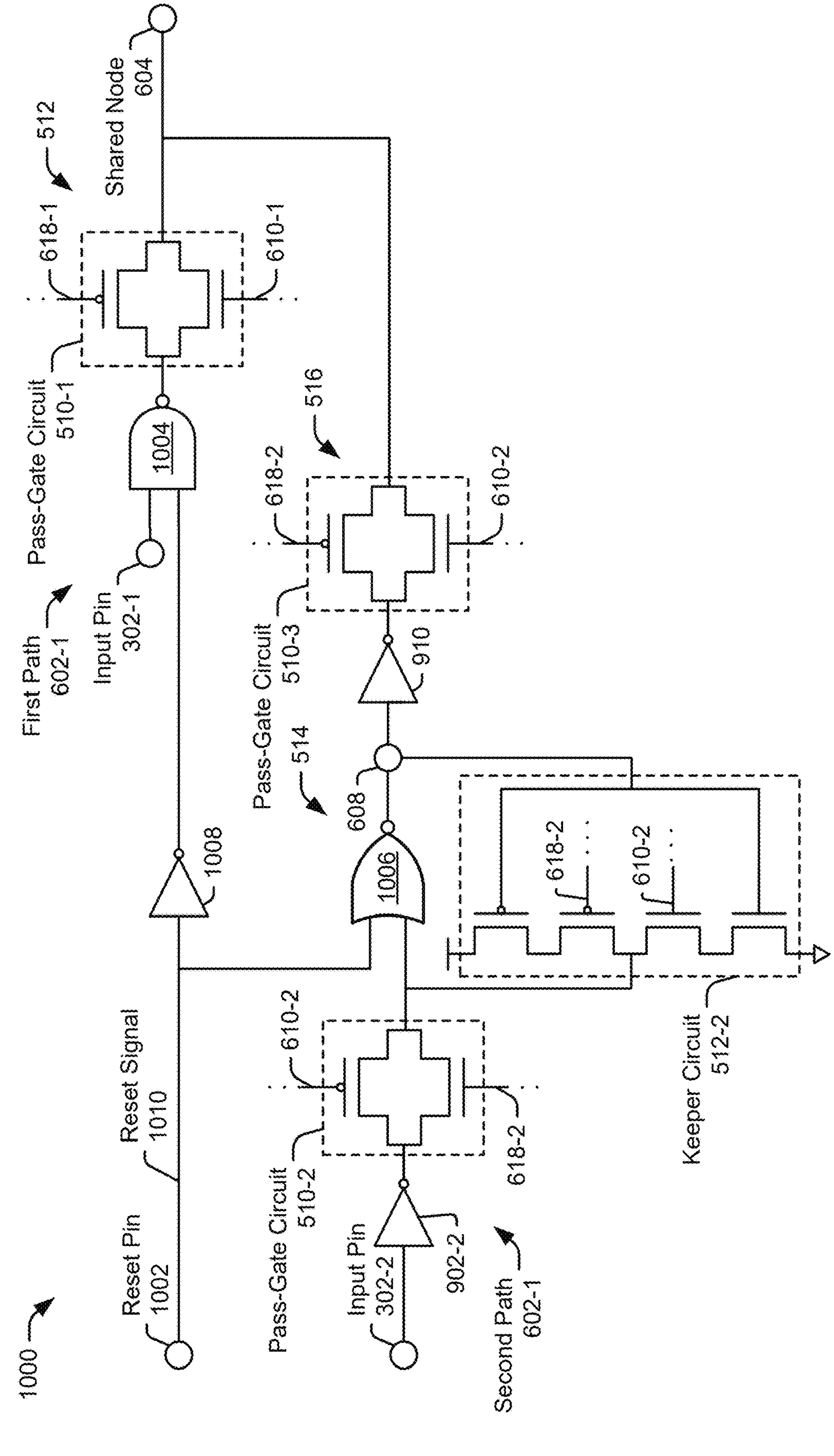
Figures 2, 10:
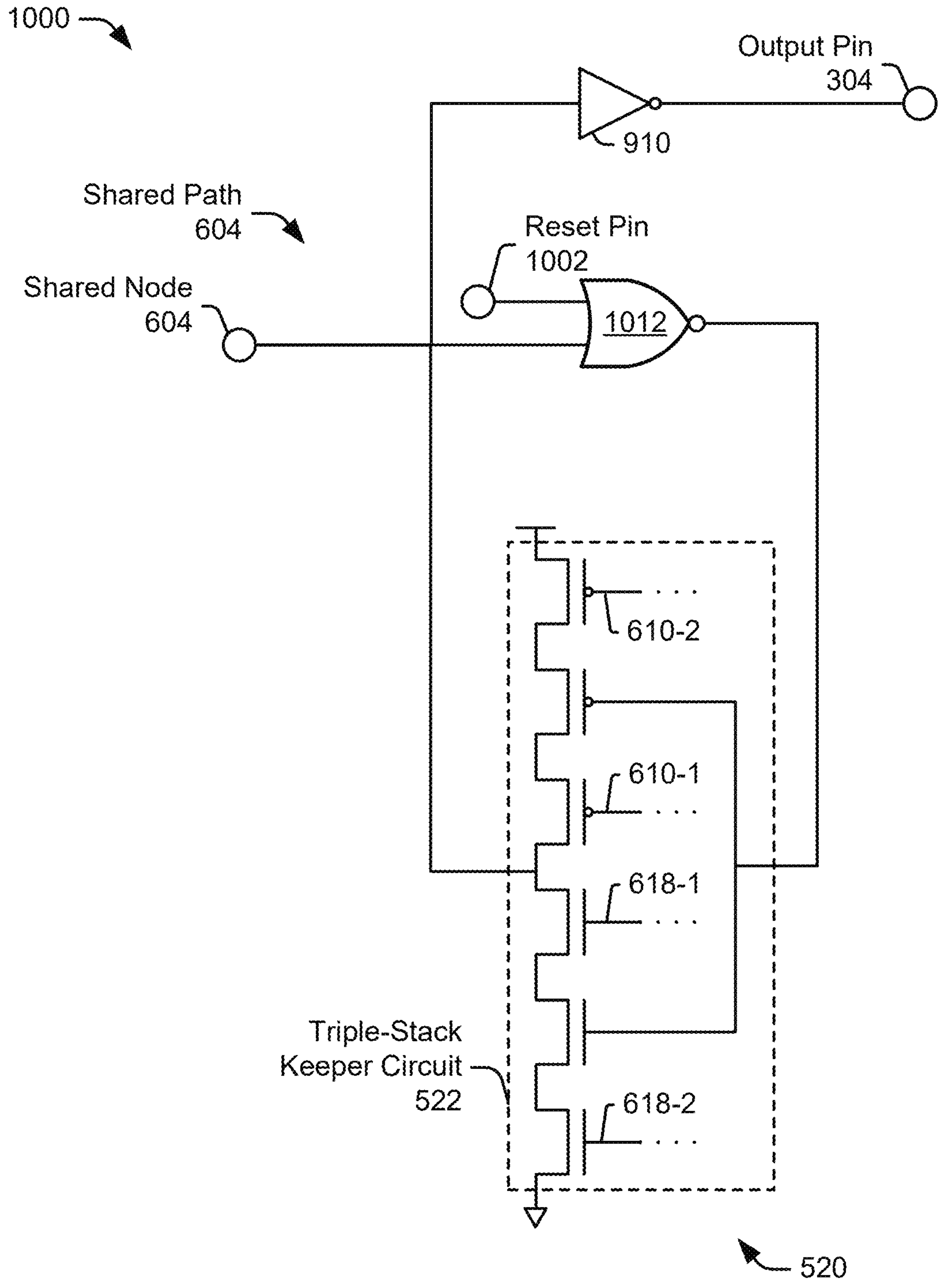

To implement the high-speed architecture 108, the first keeper circuit 512-1 and the third keeper circuit 512-3 are combined together to form a combined keeper circuit 520. The combined keeper circuit 520 can be implemented using a triple-stack transistor circuit 522, which is shown in FIGS. 9-2 and 10-2. The pulsed-latch topology 504 and the master-slave latch topology 506 are further described with respect to FIG. 6.

Figure 6:
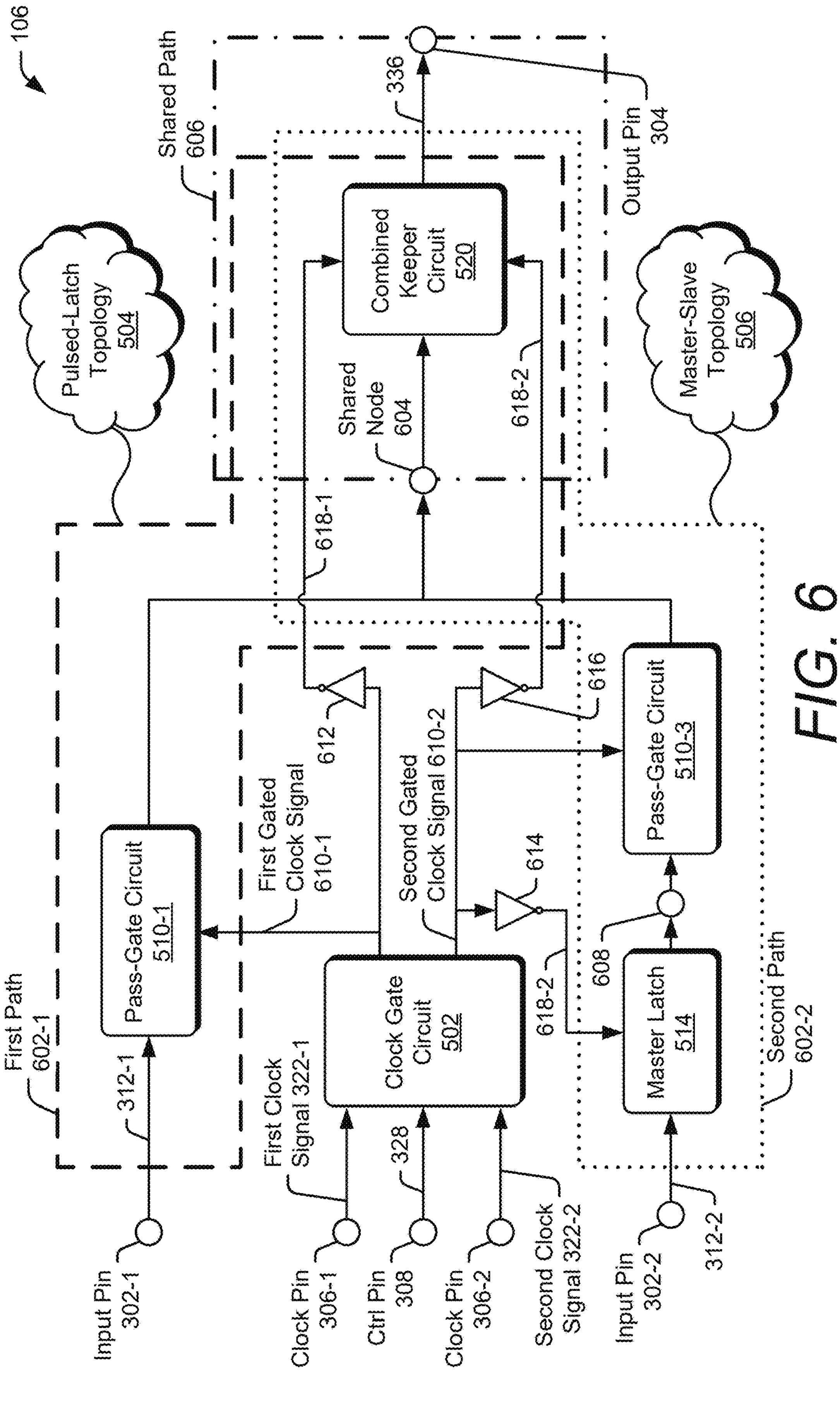
FIG. 6 illustrates an example implementation of a flip-flop with a high-speed architecture.

FIG. 6 illustrates an example implementation of the flip-flop 106 with the high-speed architecture 108. The pulsed-latch topology 504 forms a first path 602-1 of the flip-flop 106 between the first input pin 302-1 and the output pin 304. Components that form the pulsed-latch topology 504 are controlled using the first clock signal 322-1, as further described below. The first path 602-1 represents a functional path of the scan-type flip-flop 204.

The master-slave topology 506 forms a second path 602-2 of the flip-flop 106 between the second input pin 302-2 and the output pin 304. Components that form the master-slave topology 506 are controlled using the second clock signal 322-2, as further described below. The second path 602-2 represents a scan path of the scan-type flip-flop 204.

The pulsed-latch topology 504 and the master-slave topology 506 merge together at a shared node 604 of the flip-flop 106. Both the pulsed-latch topology 504 and the master-slave topology 506 share the combined keeper circuit 520, which is coupled between the shared node 604 and the output pin 304. The combined keeper circuit 520 can be controlled using the first clock signal 322-1 and the second clock signal 322-2. Portions of the first and second paths 602-1 and 602-2 that overlap each other are represented by a shared path 606, which is formed between the shared node 604 and the output pin 304.

Although not explicitly shown in FIG. 6, the latch 508 is disposed within the first path 602-1 and is represented by the first pass-gate circuit 510-1 and the combined keeper circuit 520. The first pass-gate circuit 510-1 is coupled between the first input pin 302-1 and the shared node 604. Within the second path 602-2, the master latch 514 is coupled between the second input pin 302-2 and a node 608 (e.g., an intermediate node). Although not explicitly shown in FIG. 6, the slave latch 516 is also disposed within the second path 602-2 and is represented by the third pass-gate circuit 510-3 and the combined keeper circuit 520. The third pass-gate circuit 510-3 is coupled between the node 608 and the shared node 604.

The clock gate circuit 502 is coupled to the clock pins 306-1 and 306-2 and the control pin 308. Also, the clock gate circuit 502 is coupled to the first pass-gate circuit 510-1, the master latch 514, the third pass-gate circuit 510-3, and the combined keeper circuit 520. During operation, the clock gate circuit 502 generates a first gated clock signal 610-1 based on the first clock signal 322-1 and the control signal 328. The clock gate circuit 502 also generates a second gated clock signal 610-2 based on the second clock signal 322-2 and the control signal 328. The first and second gated clocks signals 610-1 and 610-2 represent gated versions of the first and second clock signals 322-1 and 322-2, respectively. The control signal 328 causes one of the gated clock signals 610-1 and 610-2 to be active at a given time, as further described with respect to FIGS. 7-1 and 7-2.

In FIG. 6, the flip-flop 106 is shown to include inverters 612, 614, and 616. The inverter 612 is coupled between the clock gate circuit 502 and the combined keeper circuit 520. During operation, the inverter 612 generates a complementary version of the first gated clock signal 610-1, which is represented by complementary signal 618-1. The first pass-gate circuit 510-1 is controlled using the first gated clock signal 610-1, and the combined keeper circuit 520 is controlled using the complementary signal 618-1. This means that the first pass-gate circuit 510-1 and the combined keeper circuit 520 operate on different phases of the first gated clock signal 610-1.

The inverter 614 is coupled between the clock gate circuit 502 and the master latch 514. The inverter 616 is coupled between the clock gate circuit 502 and the combined keeper circuit 520. During operation, the inverters 614 and 616 generate a complementary version of the second gated clock signal 610-2, which is represented by complementary signal 618-2. The master latch 514 and the combined keeper circuit 520 are controlled using the complementary version of the second gated clock signal 610-2. In contrast, the third pass-gate circuit 510-3 is controlled using the second gated clock signal 610-2. This means that the third pass-gate circuit 510-3 operates on a first phase of the second gated clock signal 610-2 and the master latch 514 and the combined keeper circuit 520 operate on a second phase of the second gated clock signal 610-2.

In other implementations, the flip-flop 106 may not include the inverters 612, 614, and/or 616. In this case, the clock gate circuit 502 can generate the complementary signals 618-1 and 618-2, as shown in FIG. 8. Although not explicitly shown in FIG. 6, the flip-flop 106 can include other inverters to ensure the input pins 302-1 and 302-2 and the output pin 304 have a same polarity. The gating of the clock signals 322-1 and 322-2 based on the control pin 308 causes the flip-flop 106 to operate in one of two modes, which are further described with respect to FIGS. 7-1 and 7-2.

Figures 1, 7:
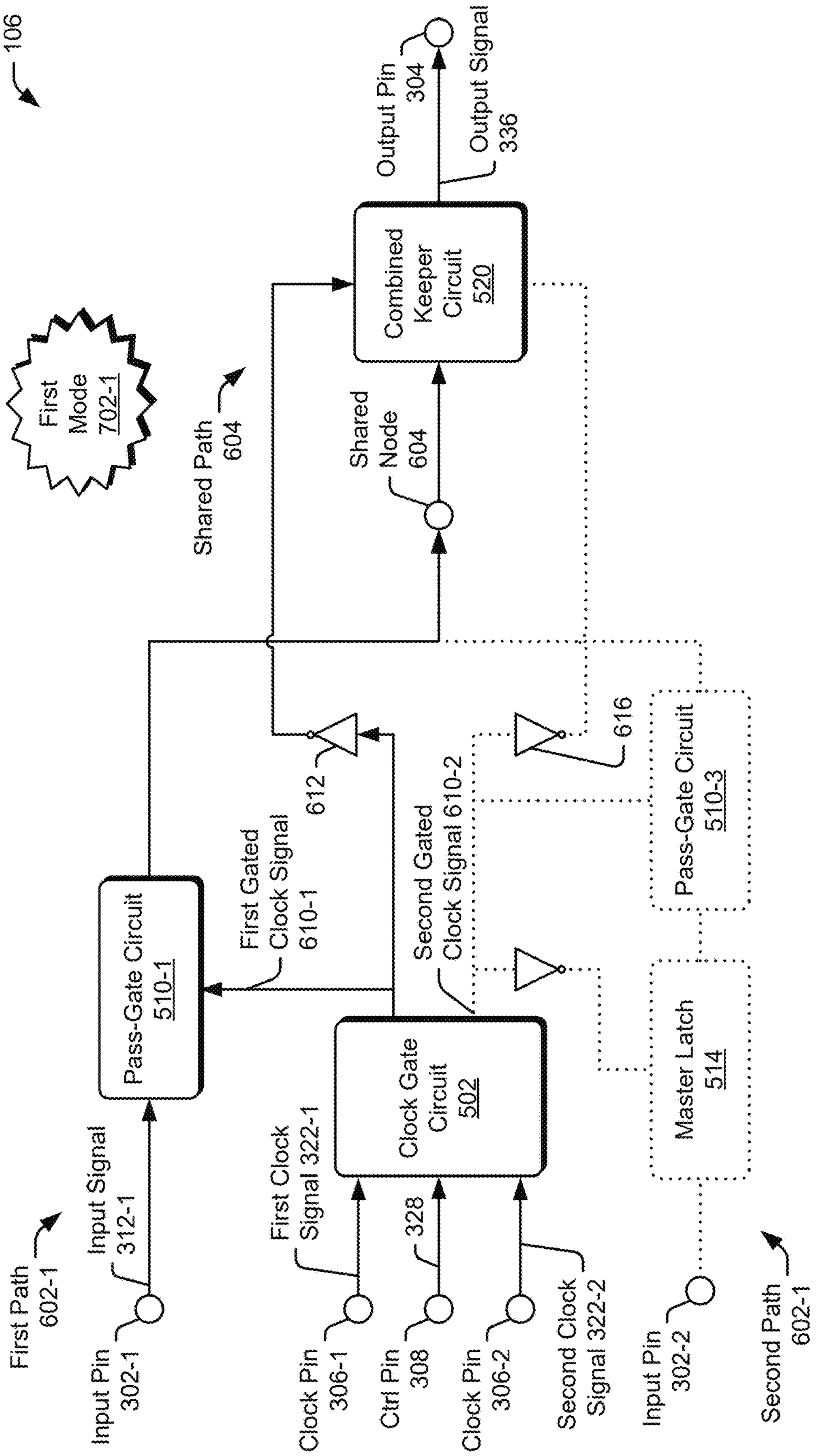
Figures 2, 7:
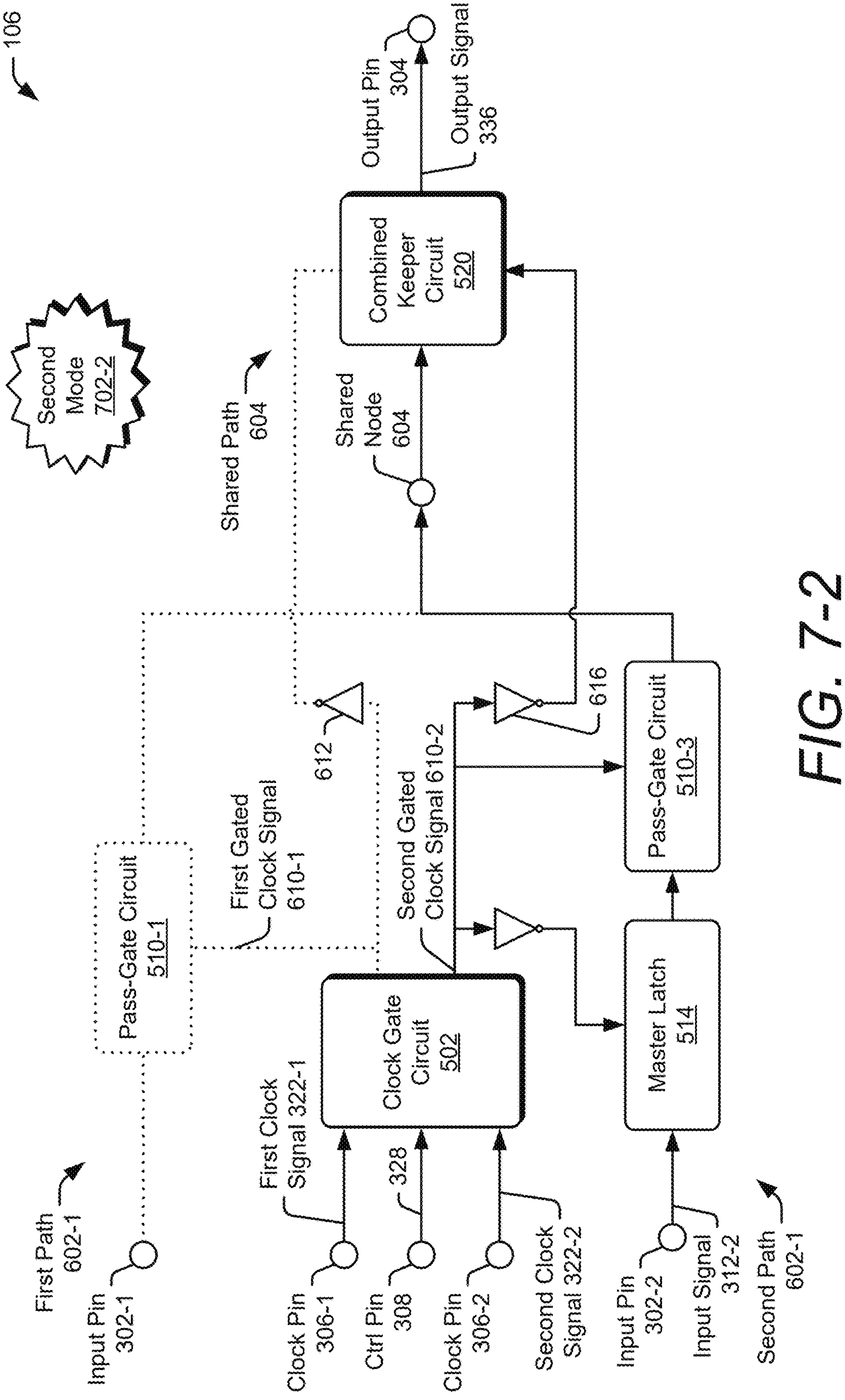
Figure 8:
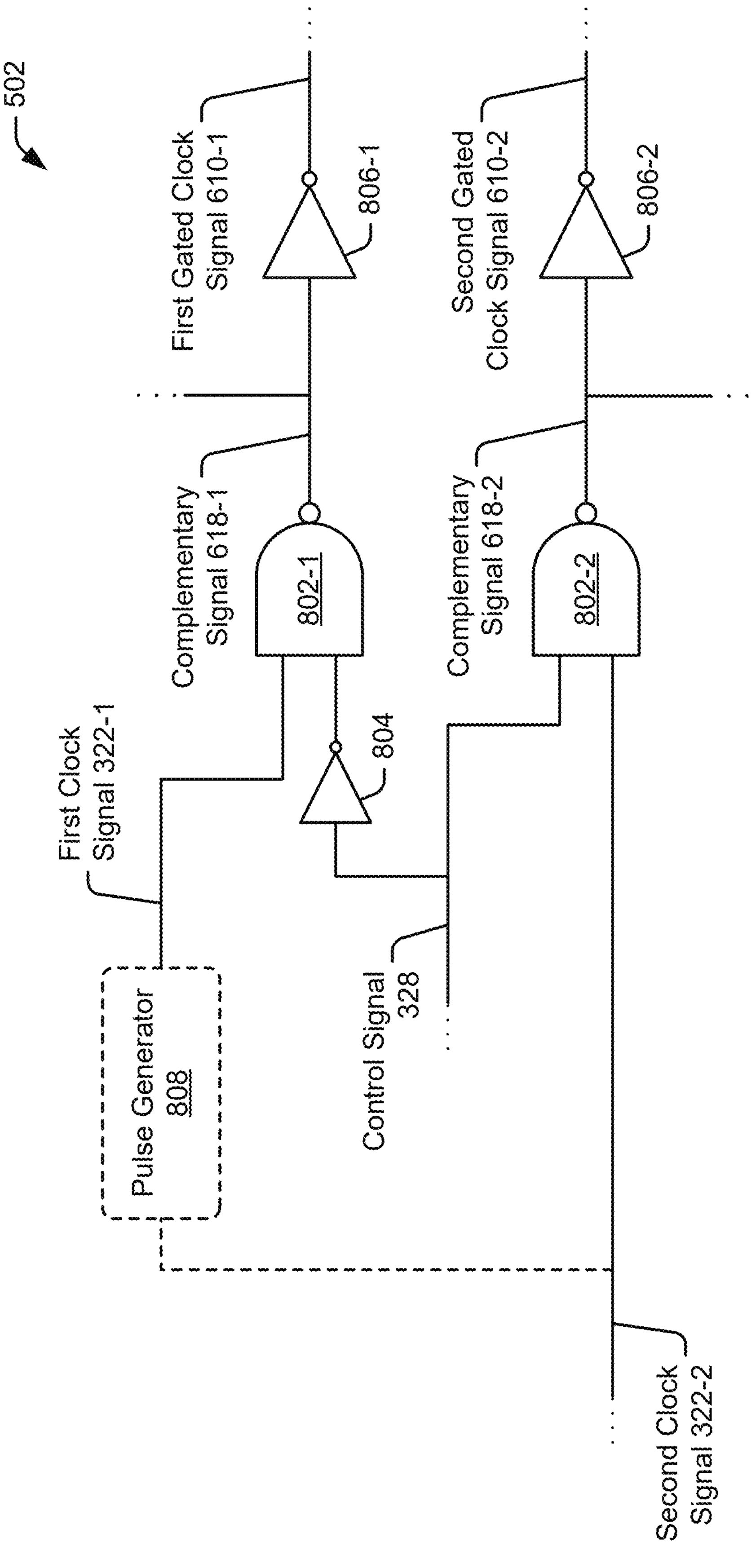
FIG. 8 illustrates an example implementation of a clock gate circuit of a flip-flop with a high-speed architecture.

FIG. 7-1 illustrates an example first mode 702-1 of the flip-flop 106 with the high-speed architecture 108. In the case of the scan-type flip-flop 204, the first mode 702-1 can also be referred to as a functional mode. The flip-flop 106 can be in the first mode 702-1 based on the control signal 328 having a first state (e.g., having a first logic value). For example, the scan-enable signal 330 can have a first logic value of "0" to cause the scan-type flip-flop 204 to be in the first mode 702-1.

The control signal 328 causes the clock gate circuit 502 to generate the first gated clock signal 610-1 and to halt the generation of the second gated clock signal 610-2. This activates (e.g., enables) the first path 602-1, as indicated by the solid lines, and deactivates (e.g., disables) the second path 602-2, as indicated by the dotted lines. As such, the first input signal 312-1 can propagate from the first input pin 302-1 to the output pin 304 via the pass-gate circuit 510-1 and the combined keeper circuit 520. Alternatively, the flip-flop 106 can operate in another mode, as further described with respect to FIG. 7-2.

FIG. 7-2 illustrates an example second mode 702-2 of the flip-flop 106 with the high-speed architecture 108. In the case of the scan-type flip-flop 204, the second mode 702-2 can also be referred to as a scan mode. The flip-flop 106 can be in the second mode 702-2 based on the control signal 328 having a second state (e.g., having a second logic value). For example, the scan-enable signal 330 can have a second logic value of "1" to cause the scan-type flip-flop 204 to be in the second mode 702-2.

The control signal 328 causes the clock gate circuit 502 to halt the generation of the first gated clock signal 610-1 and causes the clock gate circuit 502 to generate the second gated clock signal 610-2. This activates (e.g., enables) the second path 602-2, as indicated by the solid lines, and deactivates (e.g., disables) the first path 602-1, as indicated by the dotted lines. As such, the second input signal 312-1 can propagate from the second input pin 302-2 to the output pin 304 via the master latch 514, the third pass-gate circuit 510-3, and the combined keeper circuit 520. An operation of the clock gate circuit 502 is further described with respect to FIG. 8.

FIG. 8 illustrates an example implementation of the clock gate circuit 502. In this example, the clock gate circuit 502 generates the first gated clock signal 610-1, the second gated clock signal 610-2, complementary signal 618-1, and the complementary signal 618-2. Depending on the implementation, the clock gate circuit 502 can also generate the first clock signal 322-1 based on the second clock signal 322-2. In the depicted configuration, the clock gate circuit 502 includes two NAND gates 802-1 and 802-2, an inverter 804, and two inverters 806-1 and 806-2. The clock gate circuit 502 can optionally include the pulse generator 808 for implementations of the clock signal generator 208 that do not generate the first clock signal 322-1.

The NAND gates 802-1 and 802-2 are coupled to the control pin 308 (e.g., of FIG. 6). The first NAND gate 802-1 has an input that is coupled to the first clock pin 306-1 or an output of the pulse generator 808. The second NAND gate 808-2 has an input that is coupled to the second clock pin 306-2. The inverter 804 is coupled between the control pin 308 and another input of one of the NAND gates 802-1 or 802-2. In this example, the inverter 804 is coupled between the control pin 308 and the first NAND gate 802-1.

The inverters 806-1 and 806-2 are respectively coupled to the outputs of the NAND gates 802-1 and 802-2. Using the NAND gates 802-1 and 802-2 and the inverters 804, 806-1, and 806-2, the clock gate circuit 502 can generate the first and second gated clock signals 610-1 and 610-2 and the corresponding complementary signals 618-1 and 618-2. The complementary signals 618-1 and 618-2 have phases that are approximately 180 degrees different than the phases of the first and second gated clock signals 610-1 and 610-2, respectively. In other words, the complementary signals 618-1 and 618-2 represent an inverse of the first and second gated clock signals 610-1 and 610-2, respectively. As such, the first gated clock signal 610-1 and the complementary signal 618-1 form a first differential pair of gated clock signals. Likewise, the second gated clock signal 610-2 and the complementary signal 618-2 form a second differential pair of gated clock signals.

Consider an example situation in which the control signal 328 has a logic value of "0" to cause the flip-flop 106 to operate in the first mode 702-1, which can be the functional mode in some implementations. In this case, the control signal 328 causes the clock gate circuit 502 to generate the first gated clock signal 610-1 and the complementary signal 618-1. The control signal 328 also causes the clock gate circuit 502 to gate the second clock signal 322-2 (e.g., to halt the generation of the second gated clock signal 610-2 and the complementary signal 618-2). In this case, the second gated clock signal 610-2 can represent a steady-state signal that has a logic value of "0." The complementary signal 618-2 can represent another steady-state signal that has a logic value of "1."

Consider another example situation in which the control signal 328 has a logic value of "1" to cause the flip-flop 106 to operate in the second mode 702-2, which can be the scan mode in some implementations. In this case, the control signal 328 causes the clock gate circuit 502 to gate the first clock signal 322-1 (e.g., to halt the generation of the first gated clock signal 610-1 and the complementary signal 618-1). The control signal 328 also causes the clock gate circuit 502 to generate the second gated clock signal 610-2 and the complementary signal 618-2. In this case, the first gated clock signal 610-1 can represent a steady-state signal that has a logic value of "0." The complementary signal 618-1 can represent another steady-state signal that has a logic value of "1."

Other implementations of the clock gate circuit 502 are also possible. For example, the NAND gates 802-1 and 802-2 can be replaced with AND gates. As another example, the inverter 804 can be coupled to the input of the second NAND gate 802-2 instead of the input of the first NAND gate 802-1 depending on the states of the control signal 328. An example implementation of the scan-type flip-flop 204 is further described with respect to FIGS. 9-1 and 9-2.

FIG. 9-1 illustrates a first portion of an example implementation of the scan-type flip-flop 204 with the high-speed architecture 108. This first portion of the scan-type flip-flop 204 includes portions of the first and second paths 602-1 and 602-2 that are distinct and do not overlap. In other words, the first portion of the scan-type flip-flop 204 shown in FIG. 9-1 includes components that are disposed between the input pins 302-1 and 302-2 and the shared node 604.

In the depicted portion, the scan-type flip-flop 204 implements the pass-gate circuits 510-1 to 510-3 using a differential pair of transistors (e.g., a complementary pair of transistors). In this case, the pass-gate circuits 510-1 to 510-3 each include a p-type metal-oxide semiconductor field-effect transistor (PMOSFET) and an n-type metal-oxide semiconductor field-effect transistor (NMOSFET), which are coupled together in parallel. The gates of the PMOSFET and the NMOSFET are controlled by a differential pair of clock signals, as further described below.

In the case of the first pass-gate circuit 510-1, the PMOSFET is controlled by the complementary signal 618-1 and the NMOSFET is controlled by the first gated clock signal 610-1. For the second pass-gate circuit 510-2, the PMOSFET is controlled by the second gated clock signal 610-2, and the NMOSFET is controlled by the complementary signal 618-2. In the case of the third pass-gate circuit 510-3, the PMOSFET is controlled by the complementary signal 618-2 and the NMOSFET is controlled by the second gated clock signal 610-2.

The second keeper circuit 512-2 can be implemented using a dual-stack transistor circuit. In this case, two differential pairs of transistors are coupled in series between a supply voltage and a ground. One of the different pairs has gate terminals that are coupled together. Another one of the differential pairs has gate terminals that are respectively coupled to the second gated clock signal 610-2 and the complementary signal 618-2. In this case, the NMOSFET of the differential pair is controlled by the second gated clock signal 610-2 and the PMOSFET of the differential pair is controlled by the complementary signal 618-2.

In this example implementation, inverters 902-1 and 902-2 are respectively positioned between the input pins 302-1 and 302-2 and the pass-gate circuits 510-1 and 510-2. Two inverters 904 and 906 are coupled between the second pass-gate circuit 510-2 and the third pass-gate circuit 510-3. The inverter 904 is coupled between the second pass-gate circuit 510-2 and the node 608. The inverter 906 is coupled between the node 608 and the third pass-gate circuit 510-3. The second keeper circuit 512-2 has an output coupled to the pass-gate circuit 510-2 and an input coupled to the node 608. Another portion of the scan-type flip-flop 204 is further described with respect to FIG. 9-2.

FIG. 9-2 illustrates a second portion of the example implementation of the scan-type flip-flop 204 with the high-speed architecture 108. This second portion of the scan-type flip-flop 204 includes the shared path 604, which represents portions of the first and second paths 602-1 and 602-2 that overlap. In other words, the second portion of the scan-type flip-flop 204 shown in FIG. 9-2 includes components that are disposed between the shared node 604 and the output pin 304.

In this portion, the scan-type flip-flop 204 is shown to include an inverter 908, which is coupled between the shared node 604 and an input of the triple-stack keeper circuit 522. The scan-type flip-flop 204 also includes an inverter 910, which is coupled between the shared node 604 and the output pin 304.

The triple-stack keeper circuit 522 includes three differential pairs of transistors, which are coupled together in series between a supply voltage and a ground. A first different pair has gate terminals coupled to the inverter 908. A second differential pair has gate terminals coupled to the first gated clock signal 610-1 and the complementary signal 618-1. A third differential pair has gate terminals coupled to the second gated clock signal 610-2 and the complementary signal 618-2. The architecture shown in FIGS. 9-1 and 9-2 can also be modified to implement the settable and/or resettable scan-type flip-flop 206. An example implementation of a resettable version of the scan-type flip-flop 204 is further described with respect to FIGS. 10-1 and 10-2.

FIG. 10-1 illustrates an example first portion of a resettable scan-type flip-flop 1000 with the high-speed architecture 108. This first portion of the resettable scan-type flip-flop 1000 includes portions of the first and second paths 602-1 and 602-2 that are distinct and do not overlap. In other words, the first portion of the resettable scan-type flip-flop 1000 shown in FIG. 10-1 includes components that are disposed between the input pins 302-1 and 302-2 and the shared node 604.

The resettable scan-type flip-flop 1000 represents a version of the settable/resettable scan-type flip-flop 206 of FIG. 2, which enables resetting of the flip-flop via a reset pin 1002. The resettable scan-type flip-flop is similar to the scan-type flip-flop 204 of FIG. 9-1 with the addition of the reset pin 1002, a NAND gate 1004, and a NOR gate 1006.

The NAND gate 1004 replaces the inverter 902-1 of FIG. 9-1 and couples together the first input pin 302-1 and the reset pin 1002. The NOR gate 1006 couples together the second input pin 302-2 and the reset pin 1002 at the node 608. The resettable scan-type flip-flop also includes an inverter 1008, which is coupled between the reset pin 1002 and the input of the NAND gate 1004.

At the reset pin 1002, the resettable scan-type flip-flop 1000 can receive a reset signal 1010. The reset signal 1010 can have two different states (or two different logic values). One of the states can cause the resettable scan-type flip-flop 1000 to be in a reset state. While in the reset state, the resettable scan-type flip-flop 1000 generates the output signal 336 having a logic value of "0" at the output pin 304. Another one of the states can enable the resettable scan-type flip-flop 1000 to be in a normal state. While in the normal state, the resettable scan-type flip-flop 1000 can operate in the first mode 702-1 or the second mode 702-2. Another portion of the resettable scan-type flip-flop 1000 is further described with respect to FIG. 10-2.

FIG. 10-2 illustrates a second portion of an example implementation of the resettable scan-type flip-flop 1000 with the high-speed architecture 108. This second portion of the resettable scan-type flip-flop 1000 includes the shared path 604, which represents portions of the first and second paths 602-1 and 602-2 that overlap. In other words, the second portion of the resettable scan-type flip-flop 1000 shown in FIG. 10-2 includes components that are disposed between the shared node 604 and the output pin 304.

The portion shown in FIG. 10-2 is similar to the portion shown in FIG. 9-2 with respect to the scan-type flip-flop 204 except the inverter 908 of FIG. 9-2 is replaced by a NOR gate 1012. The NOR gate 1012 has inputs that are coupled to the shared node 604 and the reset pin 1002. An output of the NOR gate 1012 is coupled to an input of the triple-stack keeper circuit 522.

Although many of the examples included herein are described with respect to a scan-type flip-flop 204 (or versions thereof), the techniques for implementing a flip-flop 106 with a high-speed architecture 108 is not necessarily limited to scan-type flip-flops and can generally be applied to other flip-flops 106 having multiple inputs. Generally speaking, the high-speed architecture 108 is a two-path architecture, which is implemented using a hybrid combination of different topologies that are controlled by different clock signals. This hybrid combination of different topologies enables the flip-flop 106 to address and mitigate time constraints associated with other single-path architectures. The multiple topologies are not necessarily limited to the pulsed-latch topology 504 and the master-slave latch topology 506. Other topologies can be considered to implement other types of flip-flops, for instance.

Example Method

Figure 11:
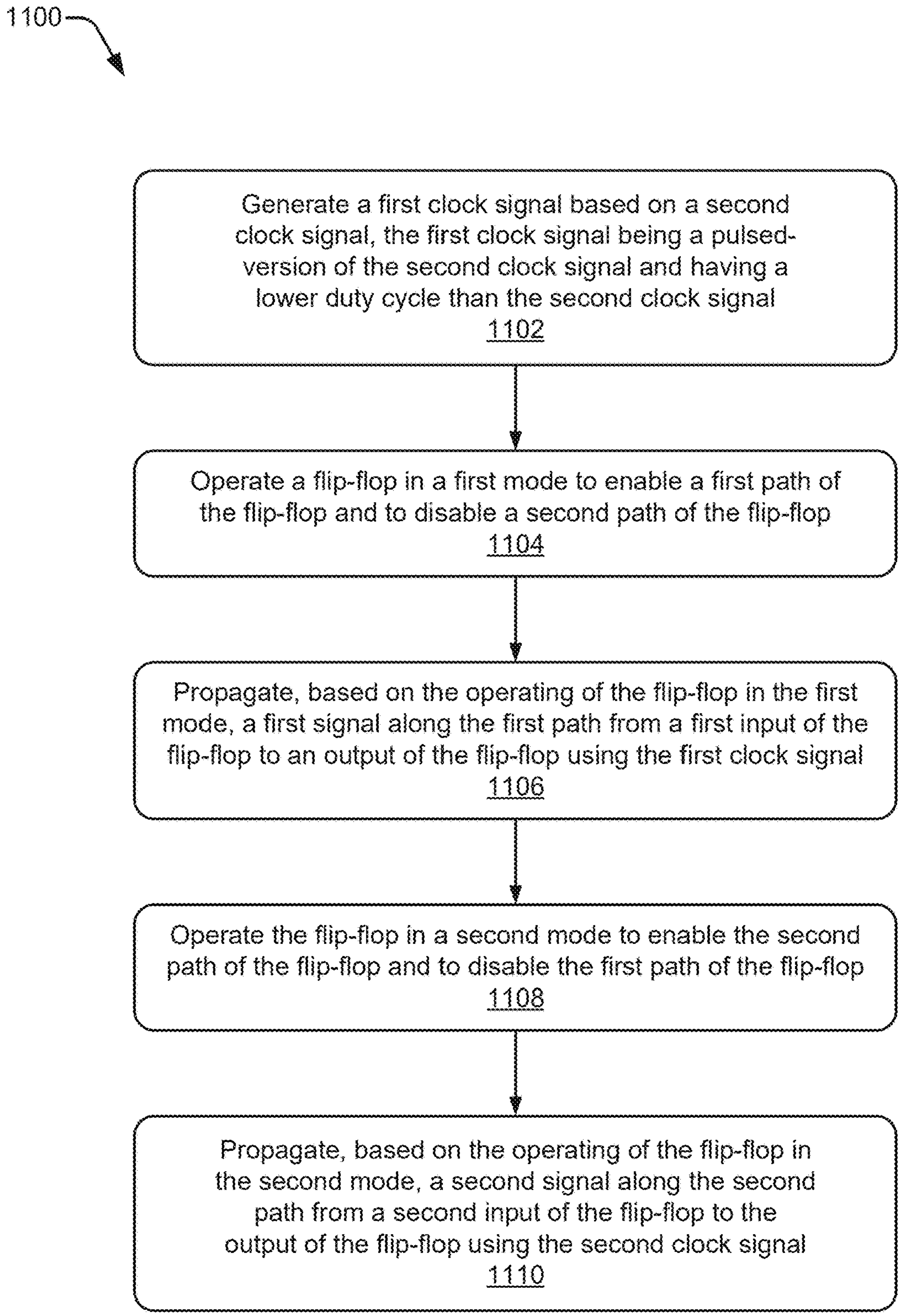
FIG. 11 illustrates an example method for operating a flip-flop with a high-speed architecture.

FIG. 11 depicts an example method 1100 for operating a flip-flop 106 with a high-speed architecture 108. Method 1100 is shown as sets of operations (or acts) performed but not necessarily limited to the order or combinations in which the operations are shown herein. Further, any of one or more of the operations may be repeated, combined, reorganized, or linked to provide a wide array of additional and/or alternate methods. In portions of the following discussion, reference may be made to the environment 100 of FIG. 1, and entities detailed in FIGS. 2 and 5, reference to which is made for example only. The techniques are not limited to performance by one entity or multiple entities operating on one device.

At 1102, a first clock signal is generated based on a second clock signal. The first clock signal is a pulsed-version of the second clock signal and has a lower duty cycle than the second clock signal. For example, the clock signal generator 208 (or in some examples the flip-flop 106 itself) generates the first clock signal 322-1 based on the second clock signal 322-2. The first clock signal 322-1 is a pulsed-version of the second clock signal 322-2 and has a lower duty cycle than the second clock signal 322-2. The first clock signal 322-1 can be referred to as a pulsed clock signal 324, as shown in FIG. 3.

At 1104, a flip-flop operates in a first mode to enable a first path of the flip-flop and to disable a second path of the flip-flop. For example, the flip-flop 106 operates in the first mode 702-1, which enables the first path 602-1 and disables the second path 602-2, as shown in FIG. 7-1. The flip-flop 106 can be placed in the first mode 702-1 based on the control signal 328 provided by the control circuit 210, as shown in FIG. 3. The first mode 702-1 can represent a functional mode of the scan-type flip-flop 204 or the settable/resettable scan-type flip-flop 206.

At 1106, a first signal propagates along the first path from a first input of the flip-flop to an output of the flip-flop using the first clock signal. The propagation is based on the flip-flop operating in the first mode. For example, the flip-flop 106 propagates the first input signal 312-1 from the first input pin 302-1 to the output pin 304 along the first path 602-1 using the first clock signal 322-1, as shown in FIG. 6. In particular, the flip-flop 106 propagates the first input signal 312-1 along the first path 602-1 using a first gated clock signal 610-1. The clock gate circuit 502 generates the first gated clock signal 610-1 based on the first clock signal 322-1 and the control signal 328, as shown in FIG. 8.

At 1108, the flip-flop operates in a second mode to enable the second path of the flip-flop and to disable the first path of the flip-flop. For example, the flip-flop 106 operates in the second mode 702-2, which enables the second path 602-2 and disables the first path 602-1, as shown in FIG. 7-2. The flip-flop 106 can be placed in the second mode 702-2 based on the control signal 328 provided by the control circuit 210, as shown in FIG. 3. The second mode 702-2 can represent a scan mode of the scan-type flip-flop 204 or the settable/resettable scan-type flip-flop 206.

At 1110, a second signal is propagated along the second path from a second input of the flip-flop to the output of the flip-flop using the second clock signal. The propagating is based on the flip-flop operating in the second mode. For example, the flip-flop 106 propagates the second input signal 312-2 along the second path 602-2 from the second input pin 302-2 to the output pin 304 using the second clock signal 322-2, as shown in FIG. 7-2. In particular, the flip-flop 106 propagates the second input signal 312-2 along the second path 602-2 using the second gated clock signal 610-2, which represents a gated version of the second clock signal 322-2. The clock gate circuit 502 generates the second gated clock signal 610-2 based on the second clock signal 322-2 and the control signal 328, as shown in FIG. 8.

Figure 12:
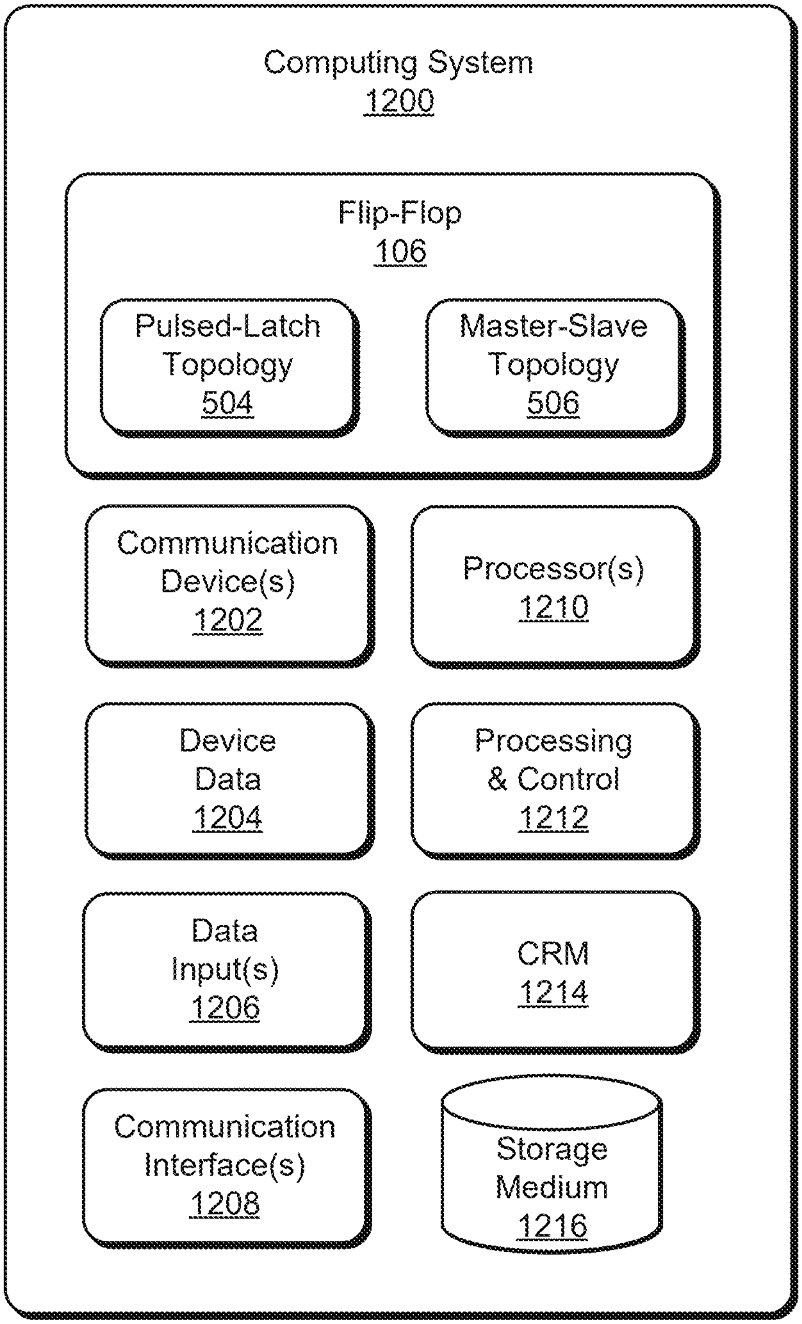
FIG. 12 illustrates an example computing system embodying, or in which techniques may be implemented that enable use of, a flip-flop with a high-speed architecture.

FIG. 12 illustrates various components of an example computing system 1200 that can be implemented as any type of client, server, and/or computing device as described with reference to the previous FIGS. 2 and 3 to implement aspects of a flip-flop 106 with a high-speed architecture 108.

The computing system 1200 includes communication devices 1202 that enable wired and/or wireless communication of device data 1204 (e.g., received data, data that is being received, data scheduled for broadcast, or data packets of the data). The device data 1204 or other device content can include configuration settings of the device, media content stored on the device, and/or information associated with a user of the device. Media content stored on the computing system 1200 can include any type of audio, video, and/or image data. The computing system 1200 includes one or more data inputs 1206 via which any type of data, media content, and/or inputs can be received, such as human utterances, user-selectable inputs (explicit or implicit), messages, music, television media content, recorded video content, and any other type of audio, video, and/or image data received from any content and/or data source.

The computing system 1200 also includes communication interfaces 1208, which can be implemented as any one or more of a serial and/or parallel interface, a wireless interface, any type of network interface, a modem, and as any other type of communication interface. The communication interfaces 1208 provide a connection and/or communication links between the computing system 1200 and a communication network by which other electronic, computing, and communication devices communicate data with the computing system 1200.

The computing system 1200 includes one or more processors 1210 (e.g., any of microprocessors, controllers, and the like), which process various computer-executable instructions to control the operation of the computing system 1200. Alternatively or in addition, the computing system 1200 can be implemented with any one or combination of hardware, firmware, or fixed logic circuitry that is implemented in connection with processing and control circuits which are generally identified at 1212. Although not shown, the computing system 1200 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The computing system 1200 also includes a computer-readable medium 1214 (CRM 1214), such as one or more memory devices that enable persistent and/or non-transitory data storage (i.e., in contrast to mere signal transmission), examples of which include random access memory (RAM), non-volatile memory (e.g., any one or more of a read-only memory (ROM), flash memory, EPROM, EEPROM, etc.), and a disk storage device. The disk storage device may be implemented as any type of magnetic or optical storage device, such as a hard disk drive, a recordable and/or rewriteable compact disc (CD), any type of a digital versatile disc (DVD), and the like. The computing system 1200 can also include a mass storage medium device (storage medium) 1216.

The computer-readable medium 1214 provides data storage mechanisms to store the device data 1204, as well as various device applications and any other types of information and/or data related to operational aspects of the computing system 1200. For example, an operating system can be maintained as a computer application with the computer-readable medium 1214 and executed on the processors 1210. The device applications may include a device manager, such as any form of a control application, software application, signal-processing and control module, code that is native to a particular device, a hardware abstraction layer for a particular device, and so on.

The computing system 1200 also includes one or more flip-flops 106 with the high-speed architecture 108. These flip-flops 106 includes two separate paths. One of the paths has the pulsed-latch topology 504 and the other path has the master-slave topology 506.

Conclusion

Although techniques using, and apparatuses including, a flip-flop with a high-speed architecture have been described in language specific to features and/or methods, it is to be understood that the subject of the appended claims is not necessarily limited to the specific features or methods described. Rather, the specific features and methods are disclosed as example implementations of a flip-flop with a high-speed architecture.

Some Examples are described below.

Example 1: A method comprising:

A method comprising:

- generating a first clock signal based on a second clock signal, the first clock signal being a pulsed-version of the second clock signal and having a lower duty cycle than the second clock signal;
- operating a flip-flop in a first mode to enable a first path of the flip-flop and to disable a second path of the flip-flop;
- propagating, based on the operating of the flip-flop in the first mode, a first signal along the first path from a first input of the flip-flop to an output of the flip-flop using the first clock signal;
- operating the flip-flop in a second mode to enable the second path of the flip-flop and to disable the first path of the flip-flop; and
- propagating, based on the operating of the flip-flop in the second mode, a second signal from a second input of the flip-flop to the output along the second path using the second clock signal.

Example 2: The method of example 1 or any other example, wherein:

- the propagating of the first signal along the first path comprises passing the first signal through a pulsed-latch topology of the flip-flop using the first clock signal; and
- the propagating of the second signal along the second path comprises passing the second signal through a master-slave latch topology of the flip-flop using the second clock signal.

Example 3: The method of example 1 or any other example, wherein the propagating of the first signal along the first path and the propagating of the second signal along the second path further comprises:

- passing the first signal and the second signal through a shared node of the flip-flop; and
- passing the first signal and the second signal through a keeper circuit of the flip-flop using the first clock signal and the second clock signal, the keeper circuit coupled between the shared node and the output, the keeper circuit and the shared node being disposed within the first path and the second path.

Example 4: The method of example 3 or any other example, wherein the passing of the first signal and the second signal through the keeper circuit comprises:

- propagating the first signal and the second signal through a triple-stack transistor circuit; and
- retaining the first signal or the second signal at the shared node by controlling a first transistor of the triple-stack transistor circuit using the first clock signal and by controlling a second transistor of the triple-stack transistor circuit using the second clock signal.

Example 5: The method of example 1 or any other example, further comprising:

- receiving a control signal that causes the flip-flop to be in the first mode or the second mode; and
- selectively gating the first clock signal or the second clock signal based on the control signal.

Example 6: The method of example 1 or any other example, wherein:

- the flip-flop is a scan-type flip-flop;
- the first input comprises a data pin of the scan-type flip-flop; and
- the second input comprises a scan-in pin of the scan-type flip-flop.

Example 7: The method of example 6 or any other example, wherein:

- the scan-type flip-flop comprises a resettable scan-type flip-flop;
- the method further comprises:
  - receiving a reset signal at a reset pin of the resettable scan-type flip-flop; and resetting a logic value held at the output based on the reset signal being in a first state; and the propagating of the first signal and the second signal is based on the reset signal being in a second state that is different than the first state.

Example 8: The method of example 1 or any other example, wherein:

the operating of the flip-flop in the first mode comprises:

enabling a first pass-gate circuit in the first path based on the flip-flop being in the first mode; and disabling a second pass-gate circuit in the second path based on the flip-flop being in the first mode; and the operating of the flip-flop in the second mode comprises:

enabling the second pass-gate circuit in the second path based on the flip-flop being in the second mode; and disabling the first pass-gate circuit in the first path based on the flip-flop being in the second mode.

Example 9: The method of example 8 or any other example, wherein:

the propagating of the first signal along the first path comprises:

passing, during a first time period, the first signal through the first pass-gate circuit based on a first phase of the first clock signal; and holding, during the first time period and using a first keeper circuit of the flip-flop, the first signal at the output of the flip-flop based on a second phase of the first clock signal; and the propagating of the second signal along the second path comprises:

passing, during a second time period, the second signal through the second pass-gate circuit based on a first phase of the second clock signal;

holding, during the second time period and using a second keeper circuit of the flip-flop, the second signal at an intermediate node of the flip-flop during a second phase of the second clock signal;

passing, during the second time period, the second signal held at the intermediate node through a third pass-gate circuit of the flip-flop during the second phase of the second clock signal; and holding, during the second time period and using the first keeper circuit, the second signal at the output of the flip-flop during the first phase of the second clock signal.

Example 10: An apparatus comprising:

a flip-flop having an architecture comprising:

a first path having a pulsed-latch topology between a first input of the flip-flop and an output of the flip-flop;

a second path having a master-slave topology between a second input of the flip-flop and the output of the flip-flop; and a keeper circuit that is coupled between a shared node of the flip-flop and the output, the keeper circuit existing within the first and second paths, the keeper circuit representing a portion of the pulsed-latch topology and representing a portion of the master-slave topology.

Example 11: The apparatus of example 10 or any other example, wherein:

the flip-flop is configured to propagate a first signal along the first path based on a first clock signal;

the flip-flop is configured to propagate a second signal along the second path based on a second clock signal; and the first clock signal is a pulsed-version of the second clock signal.

Example 12: The apparatus of example 11 or any other example, wherein:

the first path comprises:

a first pass-gate circuit coupled between the first input of the flip-flop and the shared node, the first pass-gate circuit configured to receive the first clock signal; and the keeper circuit;

the second path comprises:

a master latch coupled to a second input of the flip-flop and configured to receive the second clock signal, the master latch comprising a second pass-gate circuit and a second keeper circuit; and a slave latch comprising:

a third pass-gate circuit coupled between the master latch and the shared node of the flip-flop, the third pass-gate circuit configured to receive the second clock signal; and the keeper circuit; and the keeper circuit is configured to receive the first clock signal and the second clock signal.

Example 13: The apparatus of example 12 or any other example, wherein the keeper circuit comprises:

a first transistor configured to receive the first clock signal at a gate terminal of the first transistor; and a second transistor configured to receive the second clock signal at a gate terminal of the second transistor.

Example 14: The apparatus of example 13 or any other example, wherein:

the keeper circuit comprises a triple-stack transistor circuit comprising the first transistor, the second transistor, and a third transistor coupled together in series; and the third transistor has a gate terminal coupled to the output.

Example 15: The apparatus of example 14 or any other example, wherein:

the triple-stack transistor circuit comprises three differential pairs of transistors; and the first transistor, the second transistor, and the third transistor are associated with different ones of the three differential pairs of transistors.

Example 16: The apparatus of example 14 or any other example, wherein the keeper circuit is configured to retain a first signal propagated along the first path of the flip-flop or a second signal propagated along the second path of the flip-flop at the shared node by controlling the first transistor of the triple-stack transistor circuit with the first clock signal and by controlling the second transistor with the second clock signal.

Example 17: The apparatus of example 11 or any other example, further comprising:

a clock signal generator configured to:

generate the second clock signal; and generate the first clock signal based on the second clock signal, the first clock signal having a lower duty cycle than the second clock signal.

Example 18: The apparatus of example 17 or any other example, further comprising:

a clock gate circuit coupled to the clock signal generator and configured to:

receive a control signal; and gate the first clock signal and the second clock signal based on the control signal to selectively:

enable the first path and disable the second path; or enable the second path and disable the first path.

Example 19: The apparatus of example 10 or any other example, wherein:

the flip-flop comprises a scan-type flip-flop;

the first input comprises a data pin of the scan-type flip-flop; and the second input comprises a scan-in pin of the scan-type flip-flop.

Example 20: The apparatus of example 19 or any other example, wherein the scan-type flip-flop comprises a resettable scan-type flip-flop configured to:

receive a reset signal; and reset a logic value held at the output based on the reset signal having a first state.

What is claimed is:

1. An apparatus comprising:

a flip-flop having an architecture comprising:

a first path having a pulsed-latch topology between a first input of the flip-flop and an output of the flip-flop, the pulsed-latch topology controlled by a first clock signal having a first duty cycle, the pulsed-latch topology comprising a single latch between the first input and the output, the single latch comprising a first pass-gate circuit;

a second path having a master-slave topology between a second input of the flip-flop and the output of the flip-flop, the master-slave topology controlled by a second clock signal having a second duty cycle that is greater than the first duty cycle, the master-slave topology comprising two latches, the two latches comprising pass-gate circuits that are distinct from the first pass-gate circuit of the pulsed-latch topology; and a keeper circuit that is coupled between a shared node of the flip-flop and the output, the keeper circuit existing within the first and second paths, the keeper circuit representing a portion of the pulsed-latch topology and representing a portion of the master-slave topology.

2. The apparatus of claim 1, wherein:

the flip-flop is configured to propagate a first signal along the first path based on the first clock signal;

the flip-flop is configured to propagate a second signal along the second path based on the second clock signal; and the first clock signal is a pulsed-version of the second clock signal.

3. The apparatus of claim 1, wherein:

the first path comprises:

the first pass-gate circuit coupled between the first input of the flip-flop and the shared node, the first pass-gate circuit configured to receive the first clock signal; and the keeper circuit;

the two latches of the master-slave topology comprise a master latch and a slave latch;

the pass-gate circuits of the two latches comprise a second pass-gate circuit and a third pass-gate circuit;

the second path comprises:

the master latch coupled to the second input of the flip-flop and configured to receive the second clock signal, the master latch comprising the second pass-gate circuit and a second keeper circuit; and the slave latch comprising:

the third pass-gate circuit coupled between the master latch and the shared node of the flip-flop, the third pass-gate circuit configured to receive the second clock signal; and the keeper circuit; and the keeper circuit is configured to receive the first clock signal and the second clock signal.

4. The apparatus of claim 3, wherein the keeper circuit comprises:

a first transistor configured to receive the first clock signal at a gate terminal of the first transistor; and a second transistor configured to receive the second clock signal at a gate terminal of the second transistor.

5. The apparatus of claim 4, wherein:

the keeper circuit comprises a triple-stack transistor circuit comprising the first transistor, the second transistor, and a third transistor coupled together in series; and the third transistor has a gate terminal coupled to the output.

6. The apparatus of claim 5, wherein:

the triple-stack transistor circuit comprises three differential pairs of transistors; and the first transistor, the second transistor, and the third transistor are associated with different ones of the three differential pairs of transistors.

7. The apparatus of claim 5, wherein the keeper circuit is configured to retain a first signal propagated along the first path of the flip-flop or a second signal propagated along the second path of the flip-flop at the shared node by controlling the first transistor of the triple-stack transistor circuit with the first clock signal and by controlling the second transistor with the second clock signal.

8. The apparatus of claim 1, further comprising:

a clock signal generator configured to:

generate the second clock signal; and generate the first clock signal based on the second clock signal.

9. The apparatus of claim 8, further comprising:

a clock gate circuit coupled to the clock signal generator and configured to:

receive a control signal; and gate the first clock signal and the second clock signal based on the control signal to selectively:

enable the first path and disable the second path; or enable the second path and disable the first path.

10. The apparatus of claim 1, wherein:

the flip-flop comprises a scan-type flip-flop;

the first input comprises a data pin of the scan-type flip-flop; and the second input comprises a scan-in pin of the scan-type flip-flop.

11. The apparatus of claim 10, wherein the scan-type flip-flop comprises a resettable scan-type flip-flop configured to:

receive a reset signal; and reset a logic value held at the output based on the reset signal having a first state.

12. A method performed by a flip-flop, the method comprising:

propagating, based on a first clock signal, a first signal from a first input of the flip-flop to an output of the flip-flop along a first path of the flip-flop, the first path having a pulsed-latch topology between the first input of the flip-flop and the output of the flip-flop, the pulsed-latch topology comprising a single latch between the first input and the output, the single latch comprising a first pass-gate circuit, the first clock signal having a first duty cycle; and propagating, based on a second clock signal, a second signal from a second input of the flip-flop to the output of the flip-flop along a second path of the flip-flop, the second path having a master-slave topology between the second input of the flip-flop and the output of the flip-flop, the master-slave topology comprising two latches, the two latches comprising pass-gate circuits that are distinct from the first pass-gate circuit of the pulsed-latch topology, the second clock signal having a second duty cycle that is greater than the first duty cycle, the propagating of the first signal and the propagating of the second signal comprising propagating the first signal and the second signal through a keeper circuit of the flip-flop, the keeper circuit coupled between a shared node of the flip-flop and the output of the flip-flop, the keeper circuit existing within the first and second paths, the keeper circuit representing a portion of the pulsed-latch topology and representing a portion of the master-slave topology.

13. The method of claim 12, wherein:

the first clock signal is a pulsed-version of the second clock signal.

14. The method of claim 12, wherein:

the first path comprises a first portion that is between the first input of the flip-flop and the shared node;

the second path comprises a second portion that is between the second input of the flip-flop and the shared node; and the first portion of the first path and the second portion of the second path represent distinct portions that do not overlap.

15. The method of claim 12, wherein:

the first path comprises the first pass-gate circuit and the keeper circuit, the first pass-gate circuit coupled between the first input of the flip-flop and the shared node;

the two latches of the master-slave topology comprise a master latch and a slave latch;

the pass-gate circuits of the two latches comprise a second pass-gate circuit and a third pass-gate circuit;

the second path comprises the master latch, the slave latch, and the keeper circuit, the master latch coupled to the second input of the flip-flop and comprising the second pass-gate circuit and a second keeper circuit, the slave latch comprising the third pass-gate circuit and the keeper circuit, the third pass-gate circuit coupled between the master latch and the shared node of the flip-flop; and the method further comprises:

receiving, by the first pass-gate circuit, the first clock signal;

receiving, by the master latch, the second clock signal;

receiving, by the third pass-gate circuit, the second clock signal; and receiving, by the keeper circuit, the first clock signal and the second clock signal.

16. The method of claim 15, wherein the receiving of the first clock signal and the second clock signal by the keeper circuit further comprises:

receiving, by a first transistor of the keeper circuit, the first clock signal at a gate terminal of the first transistor; and receiving, by a second transistor of the keeper circuit, the second clock signal at a gate terminal of the second transistor.

17. The method of claim 16, wherein:

the keeper circuit comprises a triple-stack transistor circuit comprising the first transistor, the second transistor, and a third transistor coupled together in series; and the third transistor has a gate terminal coupled to the output.

18. The method of claim 17, further comprising:

retaining, by the keeper circuit, the first or second signals at the shared node by controlling the first transistor of the triple-stack transistor circuit with the first clock signal and by controlling the second transistor with the second clock signal.

19. The method of claim 12, wherein:

the flip-flop comprises a scan-type flip-flop; and the method further comprises:

receiving the first signal at a data pin of the scan-type flip-flop; and receiving the second signal at a scan-in pin of the scan-type flip-flop.

20. The method of claim 12, wherein:

the flip-flop comprises a resettable scan-type flip-flop; and the method further comprises:

receiving a reset signal; and resetting a logic value held at the output based on the reset signal having a first state.

* * * * *